(12) United States Patent
Hirayama et al.

(10) Patent No.: US 7,691,202 B2
(45) Date of Patent: Apr. 6, 2010

(54) ULTRAVIOLET LIGHT-EMITTING DEVICE IN WHICH P-TYPE SEMICONDUCTOR IS USED

(75) Inventors: Hideki Hirayama, Wako (JP); Sohachi Iwai, Wako (JP); Yoshinobu Aoyagi, Wako (JP)

(73) Assignee: Riken, Saitama (JP)

( * ) Notice: Subject to any disclaimer, the term of this patent is extended or adjusted under 35 U.S.C. 154(b) by 0 days.

(21) Appl. No.: 11/907,280

(22) Filed: Oct. 10, 2007

(65) Prior Publication Data

US 2008/0042162 A1 Feb. 21, 2008

Related U.S. Application Data

(63) Continuation of application No. 10/626,661, filed on Jul. 25, 2003, now Pat. No. 7,309,394.

(30) Foreign Application Priority Data

Jan. 27, 2003 (JP) .............................. 2003-017397

(51) Int. Cl.
C30B 25/14 (2006.01)
(52) U.S. Cl. .............................. 117/98; 117/89; 117/95; 117/96
(58) Field of Classification Search .................. 117/89, 117/90, 95, 96, 98
See application file for complete search history.

(56) References Cited

U.S. PATENT DOCUMENTS

| | | | |
|---|---|---|---|
| 4,058,430 A | 11/1977 | Suntola et al. | |
| 4,261,771 A | 4/1981 | Dingle et al. | |
| 4,413,022 A | 11/1983 | Suntola et al. | |
| 4,767,494 A | 8/1988 | Kobayashi et al. | |
| 4,993,357 A | 2/1991 | Scholz | |
| 5,255,280 A | 10/1993 | Harui et al. | |
| 5,338,389 A * | 8/1994 | Nishizawa et al. | ............. 117/89 |
| 5,389,571 A * | 2/1995 | Takeuchi et al. | ............. 117/89 |
| 5,693,139 A | 12/1997 | Nishizawa et al. | |
| 5,724,062 A | 3/1998 | Hunter | |
| 5,730,802 A | 3/1998 | Ishizumi et al. | |
| 6,100,106 A | 8/2000 | Yamaguchi et al. | |
| 2002/0017246 A1 | 2/2002 | Kojima et al. | |
| 2002/0026892 A1 | 3/2002 | Aoyagi et al. | |
| 2002/0034861 A1 | 3/2002 | Iwata et al. | |

FOREIGN PATENT DOCUMENTS

| | | |
|---|---|---|
| JP | 5-343737 A | 12/1993 |
| JP | 11-68252 A | 3/1999 |
| JP | 2002-75879 A | 3/2002 |
| JP | 2002-93821 A | 3/2002 |

* cited by examiner

*Primary Examiner*—Robert M Kunemund
(74) *Attorney, Agent, or Firm*—Birch, Stewart, Kolasch & Birch, LLP

(57) ABSTRACT

An object is to provide an ultraviolet light-emitting device in which a p-type semiconductor which has high conductivity and an emission peak in ultraviolet region, and emits light efficiently is used. The p-type semiconductor is prepared by supplying a p-type impurity raw material at the same time or after starting supply of predetermined types of crystal raw materials, besides before starting supply of other types of crystal raw materials than the predetermined types of crystal raw materials in one cycle wherein all the types of crystal raw materials of the plural types of crystal raw materials are supplied in one time each in case of making crystal growth by supplying alternately the plural types of crystal raw materials in a pulsed manner.

9 Claims, 19 Drawing Sheets

LED TYPE I :  WITH InAlGaN LIGHT-EMITTING LAYER (EMISSION WAVELENGTH $\lambda$ =308nm)
($In_xAl_yGa_{1-x-y}N$ : x=0.02, y=0.44)

LED TYPE II : WITH InAlGaN LIGHT-EMITTING LAYER (EMISSION WAVELENGTH $\lambda$ =314nm)
($In_xAl_yGa_{1-x-y}N$ : x=0.02, y=0.40)

LED TYPE III : WITHOUT InAlGaN LIGHT-EMITTING LAYER

CRYSTAL STRUCTURE FORMED IN ACCORDANCE WITH TIMINGS SHOWN IN FIG. 3

SEQUENCES IN PULSES FOR FEEDING RAW MATERIALS

CRYSTAL STRUCTURE FORMED IN ACCORDANCE WITH TIMINGS SHOWN IN FIG. 5

SCHEMATIC DIAGRAM FOR MOCVD REACTION TUBE

PRESSURE IN REACTION TUBE : 76Torr

DEPENDENCE OF Si FEED RATE IN HOLE CONCENTRATION OF AlGaN DOPED WITH Mg-Si

ULTRAVIOLET OUTPUT SPECTRA OF LED TYPE I

ULTRAVIOLET OUTPUT SPECTRA OF LED TYPE III

ULTRAVIOLET LIGHT-EMITTING DEVICE IN WHICH P-TYPE SEMICONDUCTOR IS USED

BACKGROUND OF THE INVENTION

This application is a Continuation of application Ser. No. 10/626,661, filed on Jul. 25, 2003 now U.S. Pat. No. 7,309,394, the entire contents of which are hereby incorporated by reference and for which priority is claimed under 35 U.S.C. §120.

FIELD OF THE INVENTION

The present invention relates to an ultraviolet light-emitting device in which a p-type semiconductor is used, and more particularly to an ultraviolet light-emitting device in which a p-type semiconductor having a peak in ultraviolet wavelength region is used.

DESCRIPTION OF THE RELATED ART

In case of fabricating a semiconductor material, a method for doping semiconductor with impurity wherein both of crystal raw materials of plural types and impurity raw materials of plural types are supplied continuously, whereby a crystal layer formed from the crystal raw materials on a substrate is doped with the impurities in a predetermined apparatus for crystal growth and the like has been heretofore known.

Incidentally, since both the plural types of crystal raw materials and the plural types of impurity raw materials are continuously supplied, impurities of the plural types are incorporated disorderly into atomic layers of crystals formed from the crystal raw materials on the substrate.

As a consequence, there has been such a problem that effect of p-type impurity raw materials cancel that of n-type impurity raw materials (compensation effect) in the case when the above-described plural types of impurities involve p-type impurity raw materials and n-type impurity raw materials, respectively, so that a carrier concentration comes to be a difference in concentration of the p-type impurity raw materials and the n-type impurity raw materials, whereby the carrier concentration of a semiconductor material to be fabricated decreases, and it results in low conductivity.

Furthermore, when both crystal raw materials of plural types and impurity raw materials of plural types are continuously supplied to prepare a p-type semiconductor material in accordance with a conventional method for doping semiconductor with impurity, there has been such a problem that a positive hole of a high density cannot be obtained, so that its conductivity becomes low, since impurity level in forbidden gap of the p-type semiconductor material is deep and activation energy is high.

In view of the problems as mentioned above, the following manners for eliminating such problems have been proposed. Examples thereof include a method and a device for doping a semiconductor with impurities by which a carrier concentration is made to increase even in a case where a crystal layer is doped with p-type impurity raw materials as well as n-type impurity raw materials, whereby a semiconductor material having high conductivity can be prepared; a method and a device for doping a semiconductor with impurities by which a p-type semiconductor material having positive hole of high density and exhibiting high conductivity can be prepared; and a semiconductor material having high conductivity proposed by the present inventors (see Japanese Patent Laid-open No. 2002-75879).

Meanwhile, developments for high conductive p-type AlGaN exhibiting high conductivity are demanded in order to fabricate optical devices as well as electronic devices in ultraviolet wavelength region in late years.

Particularly, a p-type AlGaN material having a high Al composition ratio and exhibiting high conductivity has been indispensable to fabricate ultraviolet light-emitting device such as light-emitting diode (LED) and laser diode (LD) which emits light in ultraviolet wavelength region.

In conventional technology, however, it was difficult to obtain p-type of wide-bandgap nitride semiconductor, and particularly, it was extremely difficult to prepare a high conductive p-type semiconductor which has reached a level wherein the resulting semiconductor may be utilized practically from AlGaN having a high Al composition ratio which is, for example, 20% or higher, i.e. $Al_xGa_{1-x}N$ ($0.2 \leq x < 1$).

In this connection, it was difficult to realize an ultraviolet light-emitting device such as high efficient LED, and high efficient LD in deep ultraviolet wavelength of a wavelength of 330 nm, or shorter.

In other words, difficulty to make ultraviolet light-emitting device such as nitride ultraviolet LED, and nitride ultraviolet LD having short wavelength has been derived from bottleneck of such difficulty to obtain p-type of wide-bandgap AlGaN.

In this connection, since carrier activation ratio of p-type AlGaN exhibits a low value of 1% or less, it is required to dope AlGaN with Mg of a high concentration. Consequently, an important point for making AlGaN to be p-type has been in preparation of high quality AlGaN crystal as a result of doping AlGaN with a high concentration of Mg.

OBJECT AND SUMMARY OF THE INVENTION

The present invention has been made in view of the above-described background of the invention and problems involved in the prior art, and an object of the invention is to provide an ultraviolet light-emitting device in which a p-type semiconductor is used which has an emission peak in ultraviolet region and emits efficiently light derived from the p-type semiconductor having high conductivity.

In order to achieve the above-described object, the ultraviolet light-emitting device in which a p-type semiconductor is used according to the present invention comprises the p-type semiconductor being prepared by supplying a p-type impurity raw material at the same time or after starting supply of predetermined types of crystal raw materials, besides before starting supply of other types of crystal raw materials than the predetermined types of crystal raw materials in one cycle wherein all the types of crystal raw materials of the plural types of crystal raw materials are supplied in one time each in case of making crystal growth by supplying alternately the plural types of crystal raw materials in a pulsed manner.

Furthermore, the predetermined types of crystal raw materials are the group III elements, and other types of crystal raw materials than the predetermined types of crystal raw materials are the group V elements in the ultraviolet light-emitting device wherein a p-type semiconductor is used according to the present invention.

Moreover, the predetermined types of crystal raw materials are the group II elements, and other types of crystal raw materials than the predetermined types of crystal raw materials are the group VI elements in the ultraviolet light-emitting device wherein a p-type semiconductor is used according to the present invention.

Besides, the group III elements are Al and Ga, and the group V element is N, supply of the Al and Ga are carried out alternately with respect to that of the N in a pulsed manner, and the p-type impurity raw material is Mg in the ultraviolet light-emitting device wherein a p-type semiconductor is used according to the present invention.

Still further, the ultraviolet light-emitting device in which a p-type semiconductor is used according to the present invention comprises a desired number of times for a cycle consisting of:

a first step wherein supply of TMGa, TMAl, and $Cp_2Mg$ is commenced at a first timing, and supply of TMGa, TMAl, and $Cp_2Mg$ is finished at a second timing at which supply of TMGa, TMAl, and $Cp_2Mg$ which has been continued for a predetermined period of time was completed; and a second step wherein supply of $NH_3$ is commenced immediately after or after the second timing at which supply of TMGa, TMAl, and $Cp_2Mg$ was completed, and supply of $NH_3$ is finished at a third timing at which supply of $NH_3$ which has been continued for a pre-determined period of time was completed;

being repeated, whereby the ultraviolet light-emitting device in which a p-type semiconductor is used is prepared.

Yet further the ultraviolet light-emitting device in which a p-type semiconductor is used according to the present invention comprises the p-type semiconductor being prepared by supplying a p-type impurity raw material and an n-type impurity raw material at close timing with each other at the same time or after starting supply of predetermined plural types of crystal raw materials, besides before starting supply of other types of crystal raw materials than the predetermined plural types of crystal raw materials in one cycle wherein all the types of crystal raw materials of the plural types of crystal raw materials are supplied in one time each in case of making crystal growth by supplying alternately the plural types of crystal raw materials in a pulsed manner.

Furthermore, the p-type semiconductor is prepared by starting supply of the p-type impurity raw material in synchronous with commencement of supply for the predetermined plural types of crystal raw materials, starting supply of the n-type impurity raw material after finishing supply of the p-type impurity raw material, and finishing supply of the n-type impurity before commencement of supply for other types of crystal raw materials than the predetermined plural types of crystal raw materials in the ultraviolet light-emitting device wherein a p-type semiconductor is used according to the present invention.

Moreover, the p-type semiconductor is prepared by maintaining a period of time wherein the p-type impurity raw material and the n-type impurity raw material are supplied at the same time, respectively, in the ultraviolet light-emitting device wherein a p-type semiconductor is used according to the present invention.

Still further, the predetermined plural types of crystal raw materials are the group III elements, and the other types of crystal raw materials than the predetermined plural types of crystal raw materials are the group V elements in the ultraviolet light-emitting device wherein a p-type semiconductor is used according to the present invention.

Yet further, the predetermined plural types of crystal raw materials are the group II elements, and the other types of crystal raw materials than the predetermined plural types of crystal raw materials are the group VI elements in the ultraviolet light-emitting device wherein a p-type semiconductor is used according to the present invention.

Besides, the group III elements are Al and Ga, and the group V element is N, supply of the Al and Ga is carried out alternately with respect to that of the N in a pulsed manner, the first impurity raw material is Mg, and the second impurity raw material is Si in the ultraviolet light-emitting device wherein a p-type semiconductor is used according to the present invention.

Furthermore, the ultraviolet light-emitting device wherein a p-type semiconductor is used according to the present invention comprises a desired number of times for a cycle consisting of:

a first step wherein supply of TMGa, TMAl, and $Cp_2Mg$ is commenced at a first timing, and supply of $Cp_2Mg$ is finished at a second timing at which supply of $Cp_2Mg$ which has been continued for a predetermined period of time was completed;

a second step wherein supply of TESi is commenced immediately after or after the second timing at which supply of $Cp_2Mg$ was finished, and supply of TMGa, TMAl, and TESi is finished at a third timing at which supply of TESi has been continued for a predetermined period of time was completed; and a third step wherein supply of $NH_3$ is commenced immediately after or after the third timing at which supply of TMGa, TMAl, and TESi was completed, and supply of $NH_3$ is finished at a fourth timing at which supply of $NH_3$ which has been continued for a predetermined period of time was completed;

being repeated, whereby the ultraviolet light-emitting device in which a p-type semiconductor is used is prepared.

Moreover, a small amount of N is continuously supplied in case of preparing the p-type semiconductor in the ultraviolet light-emitting device wherein a p-type semiconductor is used according to the present invention.

Besides, the ultraviolet light-emitting device wherein a p-type semiconductor is used according to the present invention comprises the p-type semiconductor being composed of AlGaN prepared by laminating a crystal layer formed from Ga and Al, and a crystal layer formed from N, a crystal layer formed from the Ga and Al being doped with Mg and Si, and Mg and Si being placed closely in the crystal layer formed from Ga and Al at a predetermined ratio.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE PREFERRED EMBODIMENTS

Figure 1:
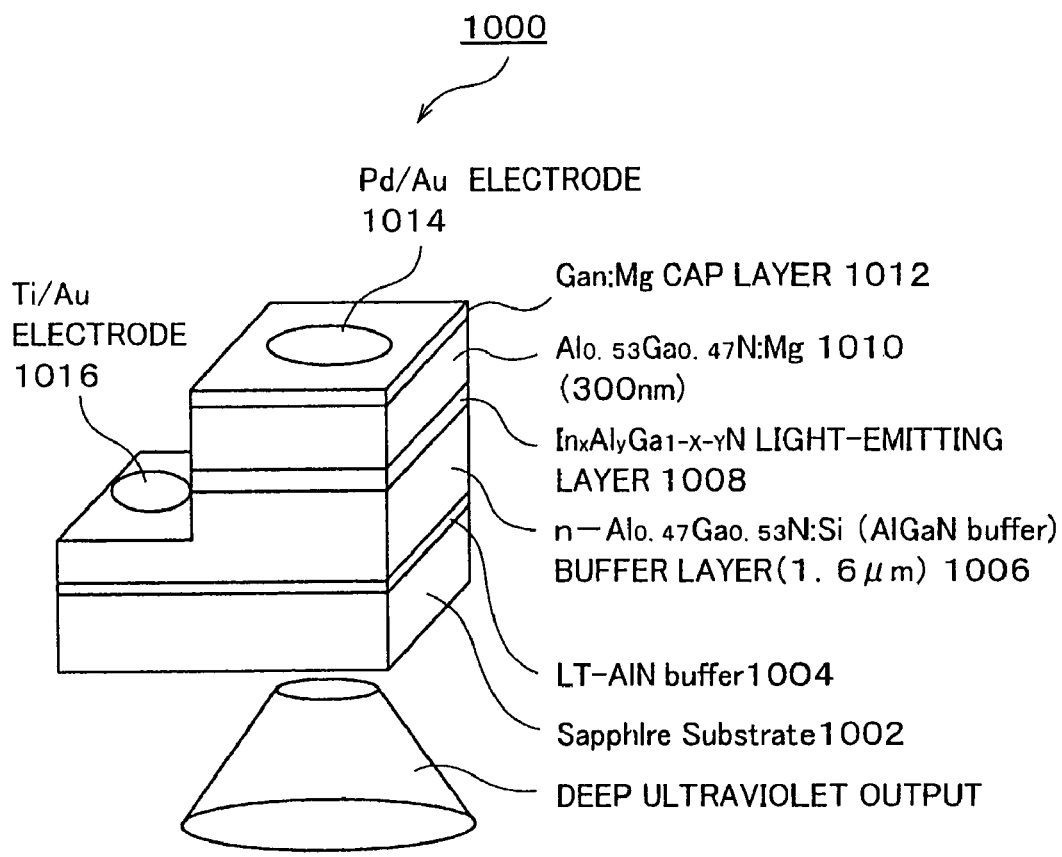
FIG. 1 is a schematic, constitutional, explanatory view illustrating an example of a preferred embodiment of an ultraviolet light-emitting device wherein a p-type semiconductor is used according to the present invention, and illustrating specifically an LED of the ultraviolet light-emitting device wherein AlGaN doped with Mg (A composition of Al is 53%: $Al_{0.53}Ga_{0.47}$:Mg) is used as a p-type semiconductor.

An example of preferred embodiments of an ultraviolet light-emitting device wherein a p-type semiconductor is used according to the present invention will be described in detail hereinafter by referring to the accompanying drawings. It is to be noted that the same reference characters are used for the same or equivalent constitutions as well as contents in any part of the following description or the accompanying drawings as or to that of the other parts throughout the specification.

FIG. 1 is a schematic, constitutional, explanatory view showing an LED being an ultraviolet light-emitting device composed of AlGaN doped with Mg (A composition of Al is 53%: $Al_{0.53}Ga_{0.47}$:Mg) for a p-type semiconductor as an example of preferred embodiment of an ultraviolet light-emitting device wherein a p-type semiconductor according to the present invention has been used.

The LED 1000 has been prepared in accordance with a low pressure metalorganic chemical vapor depositing method (MOCVD) and has been prepared by such a manner that an AlN low temperature buffer layer (LT-AlN buffer) 1004 is deposited on a sapphire substrate 1002; an n-type AlGaN doped with Si buffer layer (A composition of Al is 47%: n-$Al_{0.47}Ga_{0.53}$N:Si) 1006 is deposited on the AlN low temperature buffer layer 1004 in a thickness of 1.6 μm; an InAlGaN quaternary mixed crystal light-emitting layer ($In_xAl_yGa_{1-x-y}N$) 1008 is deposited on the n-type AlGaN doped with Si buffer layer 1006 in a thickness of 40 nm as a light-emitting layer; a p-type AlGaN layer doped with Mg (A composition of Al is 53%: $Al_{0.53}Ga_{0.47}$N:Mg) 1010 is deposited on the InAlGaN quaternary mixed crystal light-emitting layer 1008 in a thickness of 300 nm; and GaN (GaN:Mg) doped with Mg is deposited on the AlGaN layer 1010 in the form of a cap layer 1012 with a thickness of 30 nm. On the cap layer 1012 has been formed a Pd/Au (palladium/gold) electrode 1014, and a Ti/Au (titanium/gold) electrode 1016 has been formed on the AlGaN buffer layer 1006. In other words, the Pd/Au electrode 1014 has been formed on the cap layer 1012 being a p-type semiconductor, and the Ti/Au electrode 1016 has been formed on the AlGaN buffer layer 1006 being an n-type semiconductor, whereby an LED structure is obtained.

The LED 1000 has such a structure wherein the layers positioned lower than the InAlGaN ternary mixed crystal light-emitting layer 1008, i.e. the AlGaN buffer layer 1006, the AlN low temperature buffer layer 1004 as well as the sapphire substrate 1002 are transparent with respect to a wavelength of 280 nm or longer, so that deep ultraviolet (light emission in a region of deep ultraviolet wavelength) is obtained from the back of the sapphire substrate 1002 (see FIG. 1).

In the LED 1000, for the sake of activating positive hole of the AlGaN layer 1010 doped with Mg, the LED 1000 was annealed at a temperature of 850° C. in a nitrogen atmosphere of one atmospheric pressure for one hour after the crystal growth thereof.

In order to obtain high ruminant emission in deep ultraviolet with respect to the LED 1000, the InAlGaN ternary mixed crystal light-emitting layer 1008 is used as a light-emitting layer. In this respect, three types of LEDs in total are prepared in reference to the InAlGaN ternary mixed light-emitting layer 1008. Namely, there are those wherein compositions are different from one another among In, Al, and Ga which are represented by "LED type I" and "LED type II". In addition to these types, there is one involving no InAlGaN ternary mixed crystal light-emitting layer 1008 which is represented by "LED type III". The LEDs including the "LED type I", "LED type II", and "LED type III" were subjected to the undermentioned experiments.

The "LED type I" is an LED wherein a composition among In, Al, and Ga of the InAlGaN ternary mixed crystal light-emitting layer 1008 is made to be "$In_xAl_yGa_{1-x-y}N$: x=0.02, y=0.44", and an emission peak of the "LED type I" was observed at 308 nm of a light-emitting wavelength λ as mentioned hereinafter.

Moreover, the "LED type II" is an LED wherein a composition among In, Al, and Ga of the InAlGaN ternary mixed crystal light-emitting layer 1008 is made to be "$In_xAl_yGa_{1-x-y}N$: x=0.02, y=0.40", and an emission peak of the "LED type II" was observed at 318 nm of a light-emitting wavelength λ as mentioned hereinafter.

Furthermore, the "LED type III" is an LED involving no InAlGaN ternary mixed crystal light-emitting layer 1008.

In the LED 1000, the AlGaN layer 1010 doped with Mg as a p-type semiconductor was prepared in accordance with a manner wherein a crystal raw material and a p-type impurity raw material which are mentioned hereafter are alternately supplied to make crystal growth (hereinafter referred properly to as "alternate feeding method"). The other components, i.e. the sapphire substrate 1002, the AlN low temperature buffer layer 1004, the AlGaN buffer layer 1006, InAlGaN ternary mixed crystal light-emitting layer 1008, and the cap layer 1012 are prepared by making crystal growth in accordance with a conventional continuous feeding manner for crystal raw materials and impurity raw materials, the manner of which is heretofore well known. The Pd/Au electrode 1014 and the Ti/Au electrode 1016 are also prepared in accordance with a heretofore well-known conventional manner.

In the above-described preferred embodiment, although the AlGaN layer 1010 doped with Mg has been used as a p-type semiconductor, the invention is not limited thereto, as a matter of course, a variety of the other p-type semiconductors such as InAlGa and GaN which have been prepared in accordance with an alternate feeding method may be used in place of the AlGaN doped with Mg layer 1010.

Then, a process for the production of the LED 1000 will be described. In this connection, however, the sapphire substrate 1002, the AlN low temperature buffer layer 1004, the AlGaN buffer layer 1006, the InAlGaN ternary mixed crystal light-emitting layer 1008, the cap layer 1012, the Pd/Au electrode 1014, and the Ti/Au electrode 1016 may be prepared in accordance with a conventional manner well-known heretofore, and accordingly, the explanation therefor is omitted.

Thus, an alternate feeding method for preparing p-type semiconductors including the AlGaN doped with Mg layer 1010 is explained in the following description.

Figure 2:
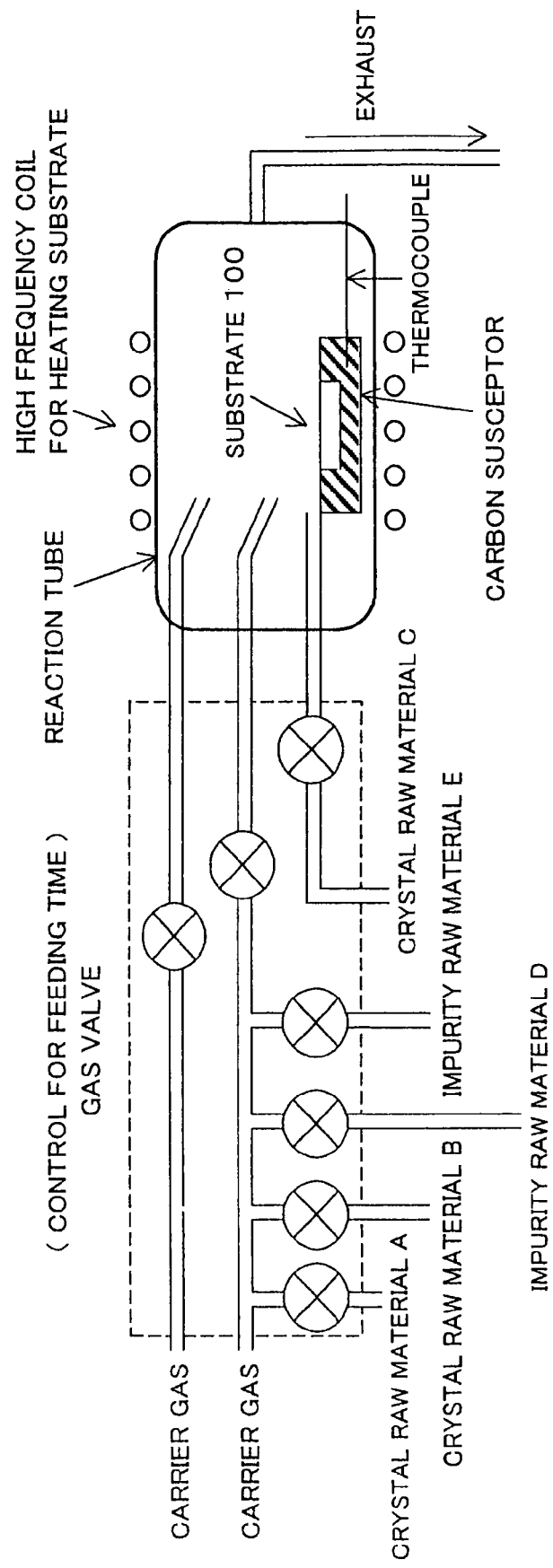
FIG. 2 is a schematic, constitutional, explanatory diagram showing an essential part of an apparatus of crystal growth for embodying an alternate feeding method for preparing a p-type semiconductor.
Figure 3:
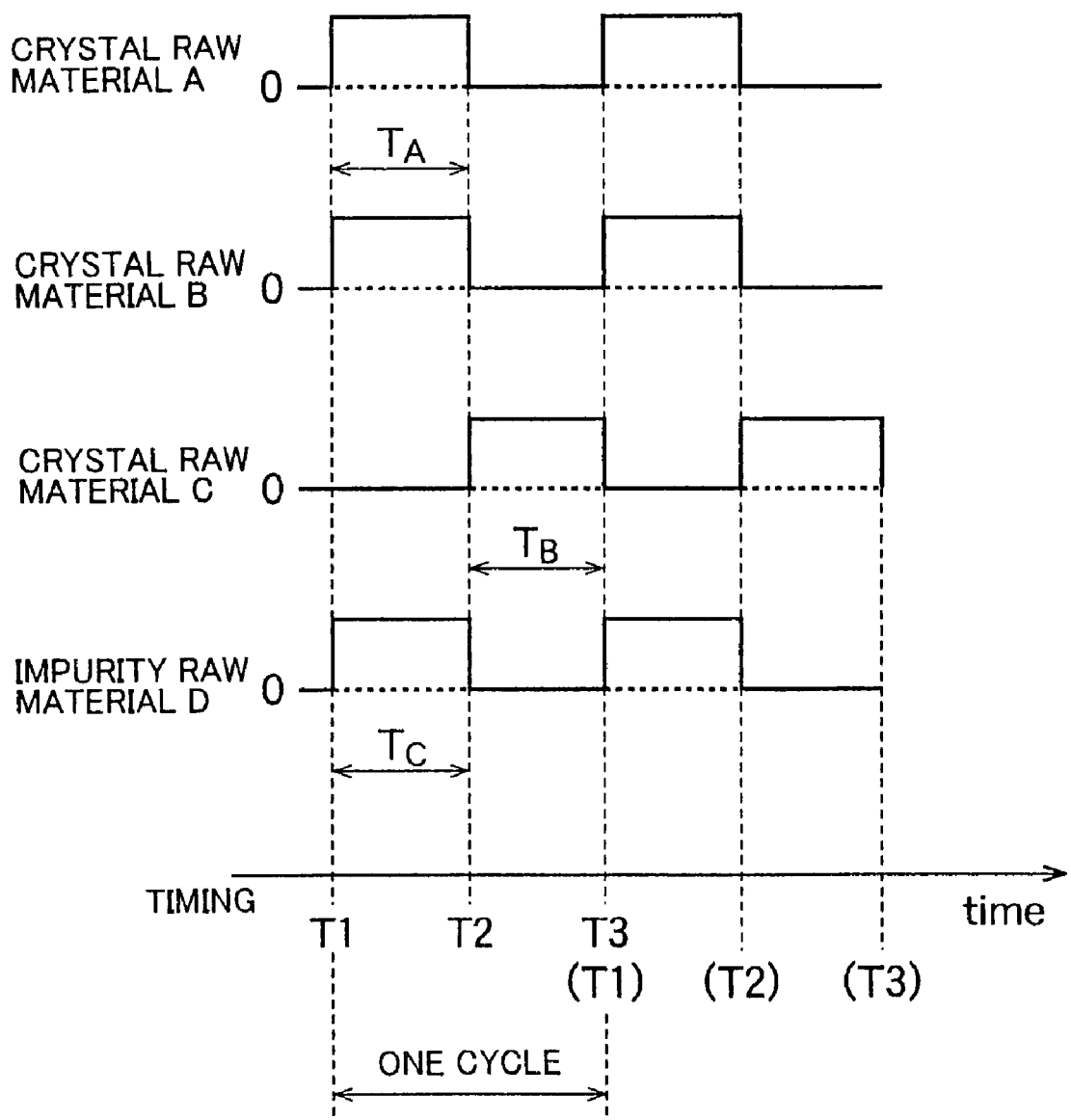
FIG. 3 is a timing chart showing an example of timing for feeding crystal raw materials and an impurity raw material in accordance with an alternate feeding method (a first manner), i.e. an example of a sequence of pulses for feeding the raw materials.
Figure 4:
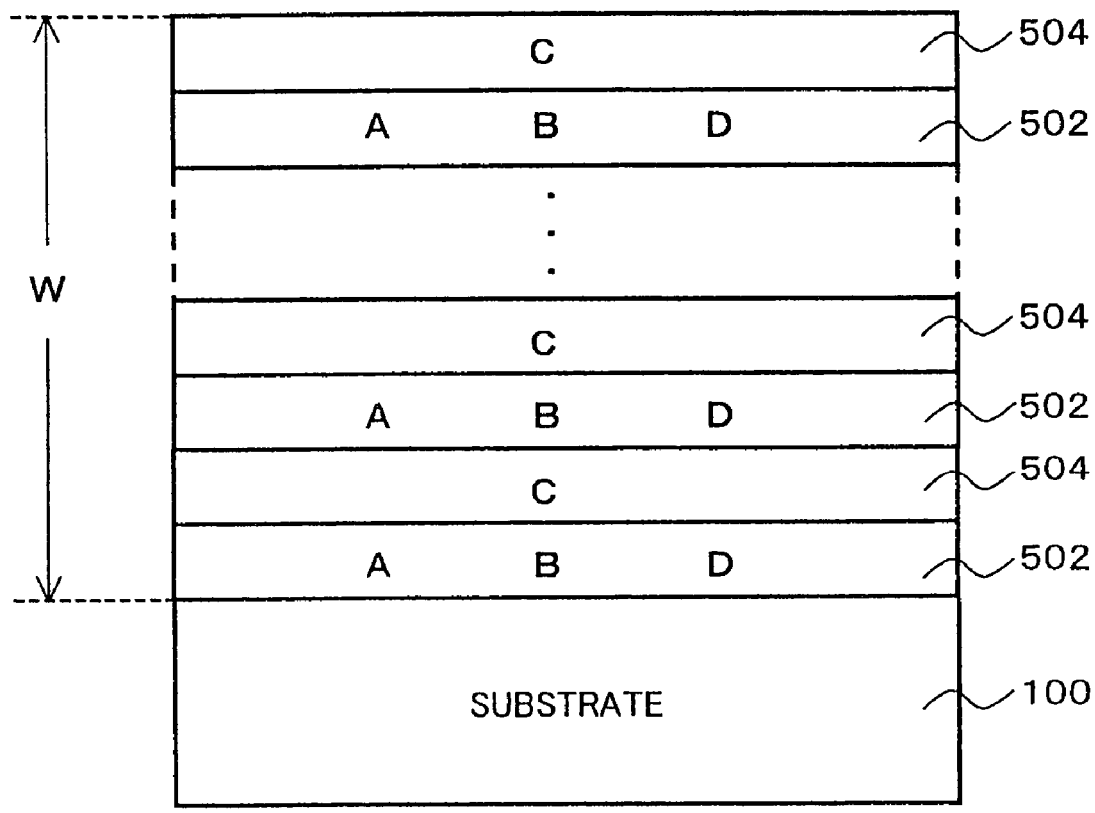
FIG. 4 is an explanatory view showing diagrammatically a crystal structure of a semiconductor material formed in accordance with the alternate feeding method (the first manner)
Figure 5:
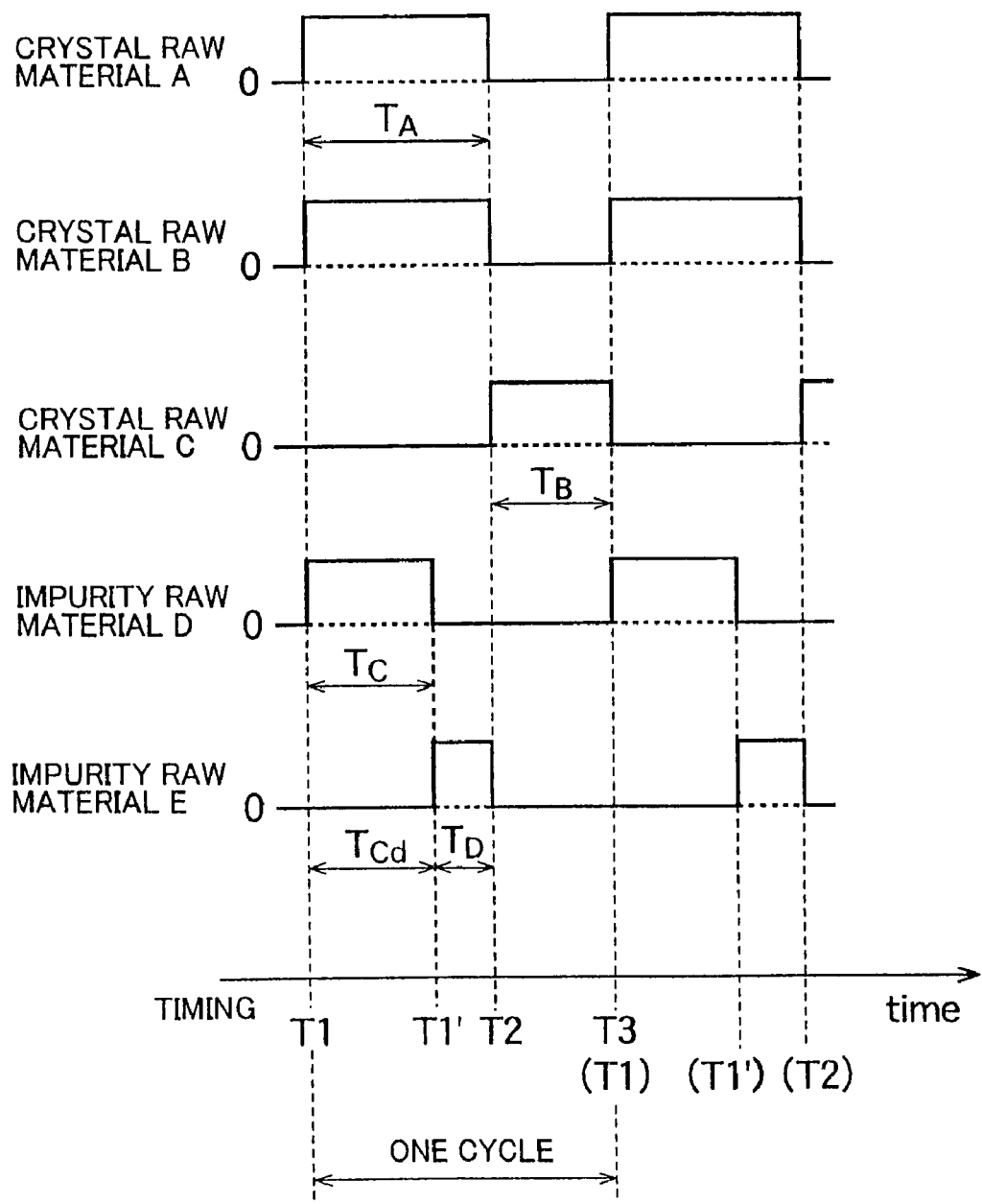
FIG. 5 is a timing chart showing an example of timing for feeding crystal raw materials and impurity raw materials in accordance with an alternate feeding method (a second manner), i.e. an example of a sequence of pulses for feeding the raw materials.
Figure 6:
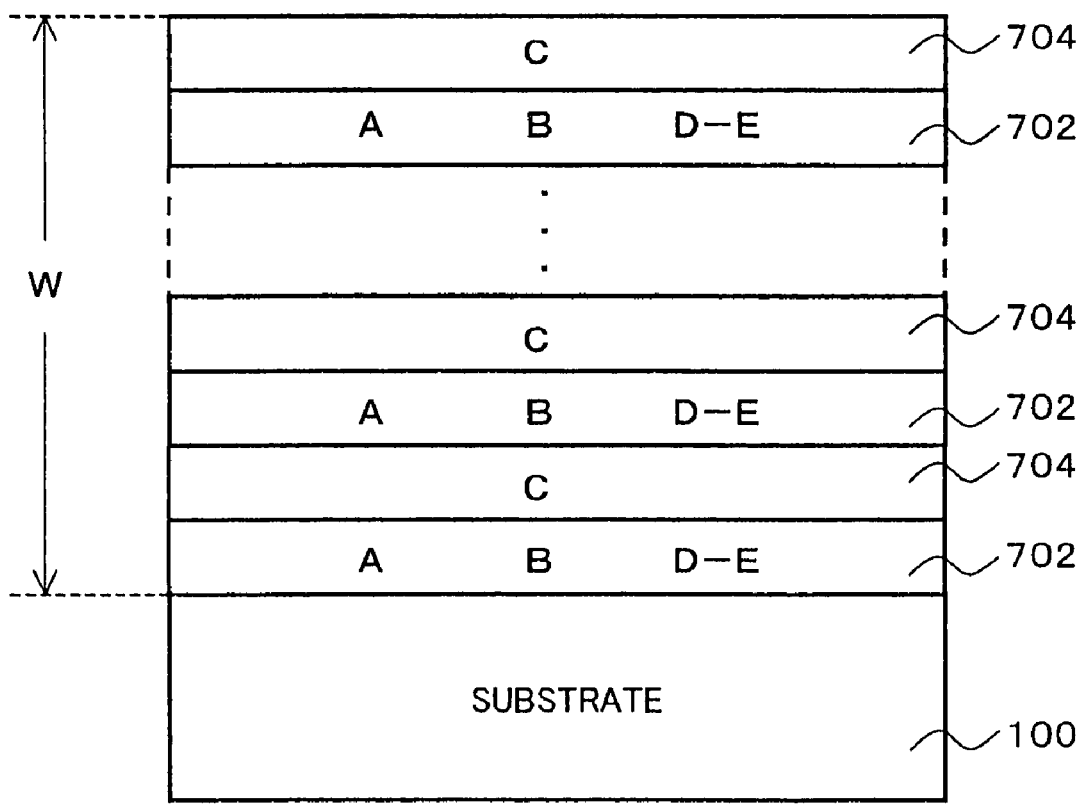
FIG. 6 is an explanatory view showing diagrammatically a crystal structure of a semiconductor material formed in accordance with the alternate feeding method (the second manner)

FIG. 2 is a schematic, constitutional, explanatory diagram showing an essential part of an apparatus of crystal growth for embodying an alternate feeding method. FIGS. 3 and 5 are timing charts each showing an example of timing for feeding crystal raw materials and an impurity raw material(s) in accordance with an alternate feeding method, i.e. an example of sequences of pulses for feeding the raw materials. FIGS. 4 and 6 are explanatory views each showing diagrammatically a crystal structure of a p-type semiconductor material prepared in accordance with an alternate feeding method.

In the following description, crystal raw materials A may be the group III and II elements such as Al, Ga, In, B, Zn, and Cd; crystal raw materials B may be the group III and II elements such as Al, Ga, In, B, Zn, and Cd; crystal raw materials C may be the group V and VI elements such as N, As, P, S, Se, and Te; impurity raw materials D may be, for example, Mg, Be, Si, O and the like; and impurity raw materials E may be, for example, Mg, Be, Si, O and the like.

However, it is to be noted that different elements should be employed from one another among the crystal raw materials A, B, and C, respectively. Furthermore, the elements used for the crystal raw materials A, B, and C are not limited to each one of the elements, but two or more types of elements may be used.

It is preferred to use the group V elements as the crystal raw materials C in the case where the group III elements are used as the crystal raw materials A and B. Moreover, it is preferred to use the group VI elements as the crystal raw materials C in the case where the group II elements are used as the crystal raw materials A and B.

Besides, it is to be arranged in such that different elements with each other should be used with respect to the impurity raw materials D and E wherein either of the different elements is employed for a p-type impurity raw material for preparing a p-type semiconductor, while the other of the different elements is employed for a n-type impurity raw material for preparing a n-type semiconductor.

First, an outline of the first manner of an alternate feeding method (hereinafter referred properly to as "first manner") will be described for easy understanding thereof.

Crystal raw materials and an impurity raw material (p-type impurity raw material) are supplied in a pulsed manner at predetermined timing into a reaction tube of a crystal growth apparatus inside which a substrate has been disposed through pipes (made from, e.g. quartz glass), respectively, and the crystal raw materials and the impurity raw material supplied react with each other inside the reaction tube to form crystal structures on the substrate (see FIG. 2. In case of implementing only the first manner, the impurity raw material E is not supplied, so that a constitution as to supply of the impurity raw material E may be deleted from that shown in FIG. 2).

More specifically, it should be arranged in such that all the crystal raw materials A, B, and C as well as the impurity raw material D (a p-type impurity raw material) are not supplied continuously, but supplied for each predetermined period of time, while each of these raw materials are not supplied for each of the other periods of time, so that they are supplied in pulsed manners, respectively, in case of effecting crystal formation with use of the crystal raw materials A, B, and C as well as the impurity raw material D in accordance with the first manner.

Namely, the crystal raw materials A and B are supplied at the same time, while the crystal raw material C is not supplied at the same time of supply of the crystal raw materials A and B. On one hand, the impurity raw material D is supplied synchronously with supply of the crystal raw materials A and B, or the impurity raw material D is supplied after commencement of supply for the crystal raw materials A and B, besides, it is supplied before commencement of supply for the crystal raw material C in a pulsed manner.

FIG. 3 is a timing chart showing an example of the first manner wherein supply of the crystal raw materials A and B are commenced simultaneously with supply of the impurity raw material D at a timing T1.

Then, the crystal raw materials A and B are supplied for a period of time $T_A$, while the impurity raw material D is supplied for a period of time $T_C$ equal to that of the time $T_A$, and supply of the crystal raw materials A and B are finished at a timing T2 simultaneously with supply of the impurity raw material D.

Thereafter, supply of the crystal raw material C is commenced immediately after the timing T2 at which supply of the crystal raw materials A and B as well as supply of the impurity raw material D are finished, the crystal raw material C is supplied for a period of time $T_B$, and supply of the crystal raw material C is finished at a timing T3.

A treatment for one cycle is completed in accordance with the above description, and the following cycle is started from another timing T1 corresponding to the above-described timing T3.

As a result of repeating such cycles as described above over a desired number of times, a crystal having a desired film thickness can be obtained as a p-type semiconductor material.

In other words, a unit wherein all of each one supply for the crystal raw materials A, B, and C as well as the impurity raw material D are carried out as described above is considered to be one cycle starting from the timing T1 and completing at the timing T3, and when such one cycle is repeated, a crystal having a desired thickness is deposited.

Accordingly, supply of the crystal raw materials A and B is implemented alternately at the timing $T_A$ with respect to supply of the crystal raw material C at the timing $T_B$ in a pulsed manner, so that supply of the crystal raw materials A and B is not carried out at the same timing with supply of the crystal raw material C.

Moreover, a timing of supply for the crystal raw material C is not limited to immediately after the timing T2 at which supply of the crystal raw materials A and B is finished, but it may be any time after lapse of a predetermined period of time from the timing T2.

Furthermore, a timing of supply for the impurity raw material D is not limited to the timing which is synchronized with the timing T1 at which supply of the crystal raw materials A and B is to be commenced, but it may be any time after the timing T1 at which supply of the crystal raw materials of A and B was started.

Point is in that supply of the impurity raw material D should be made simultaneously with or after supply of the crystal raw materials A and B, and before supply of the crystal raw material C.

In reference to a crystal structure formed in accordance with the timing indicated in FIG. 3, a layer 502 composed of the crystal raw materials A and B is formed on a substrate 100 as a result of feeding the crystal raw materials A and B for the predetermined period of time $T_A$ from the timing T1 as illustrated in FIG. 4.

In this occasion, doping with the impurity raw material D, i.e. a p-type impurity raw material is made in the layer 502 composed of the crystal raw materials A and B as a result of supplying the impurity raw material D.

Then, a layer 504 composed of the crystal raw material C is laminated on the layer 502 composed of the crystal raw materials A and B doped with the impurity raw material D as a result of feeding the crystal raw material C for a period of time $T_B$ starting from the timing T2.

Besides, when a desired number of times of the above-described one cycle (see FIG. 3) is repeated, lamination of the layer 502 composed of the crystal raw materials A and B doped with the impurity raw material D, and the layer 504 composed of the crystal raw material C is repeated in response to the number of times of repeated cycles, whereby a crystal having a desired thickness W is formed, so that the resulting crystal can be used for a p-type semiconductor material.

Next, an outline of a second manner in an alternate feeding method (hereinafter referred properly to as "second manner") will be described for the sake of easy understanding thereof.

Crystal raw materials and impurity raw materials (p-type and n-type impurity raw materials) are supplied in a pulsed manner at predetermined timing into a reaction tube of a crystal growth apparatus inside which a substrate has been disposed through pipes (made from, e.g. quartz glass), respectively, and the crystal raw materials and the impurity raw materials supplied react with each other inside the reaction tube to form crystal structures on the substrate (see FIG. 2).

More specifically, it should be arranged in such that all the crystal raw materials A, B, and C as well as the impurity raw materials D (for example, a p-type impurity raw material) and E (for example, an n-type impurity material) are not supplied continuously, but supplied for each predetermined period of time, while each of these raw materials are not supplied for each of the other periods of time, so that they are supplied in pulsed manners, respectively, in case of effecting crystal formation with use of the crystal raw materials A, B, and C as well as the impurity raw materials D and E in accordance with the second manner (see FIG. 6).

The crystal raw materials A, B, and C as well as the impurity raw material D are fed at the same timing as that in the first manner. FIG. 5 is a timing chart illustrating an example of the second manner wherein supply of the impurity raw material D is not completely synchronized with supply of the crystal raw materials A and B different from the example of the timing chart shown in FIG. 3. Namely, although a timing for starting supply of the impurity raw material D coincides with timing for starting supply of the crystal raw materials A and B, a period of time $T_C$ for supplying the impurity raw material D is set so as to be shorter than that $T_A$ for supplying the crystal raw materials A and B, and as a consequence, a timing for finishing supply of the impurity raw material D comes to be before a timing for finishing supply of the crystal raw materials A and B.

In the second manner, the impurity raw material E being the same as in the case of the impurity material D is fed synchronously with respect to supply of the crystal raw materials A and B or after starting supply of the crystal raw materials A and B, besides, the impurity raw material E is fed before starting supply of the crystal raw material C in a pulsed manner, and the impurity raw materials D and E are fed at close timings.

Specific explanation will be made on the timing chart illustrated in FIG. 5 wherein supply of the crystal raw materials A, B, and the impurity raw material D is commenced at a timing T1. Then, the crystal raw materials A and B are supplied for a period of time $T_A$, the impurity raw material D is supplied at the same time for a shorter period of time $T_C$ than that $T_A$, and supply of the impurity raw material D is finished at a timing T1'.

Thereafter, supply of the impurity raw material E is started immediately after the timing T1' at which supply of the impurity raw material D is finished, the impurity raw material E is supplied for a predetermined period of time $T_D$, and supply of the crystal raw materials A, B, and the impurity raw material E is finished at a timing T2.

Then, supply of the crystal raw material C is commenced immediately after the timing T2 at which supply of the crystal raw materials A, B, and the impurity raw material E is to be finished, the crystal raw material C is fed for a period of time $T_B$, and supply of the crystal raw material C is finished at a timing T3.

As described above, processing for one cycle is finished, and the timing T3 is considered to be another timing T1, then, the following cycles are started.

In other words, a unit wherein all of each one supply for the crystal raw materials A, B, and C as well as the impurity raw materials D and E are carried out as described above is considered to be one cycle starting from the timing T1 and completing at the timing T3, and when such one cycle is repeated, a crystal having a desired thickness is formed.

It is to be noted that a timing for starting supply of the impurity raw material E is not limited to a timing immediately after that T1' at which supply of the impurity raw material D is finished, but it may be the timing T1 at which supply of the impurity raw material D is to be commenced.

In other words, a period of time $T_{CD}$ defined between a timing for starting supply of the impurity raw material D (see the timing T1 in FIG. 5) and a timing for starting supply of the impurity raw material E (see the timing T1' in FIG. 5) may be specified to be zero to shorter than the period of time $T_c$, or it may be arranged in such that there is a period of time wherein the impurity raw materials D and E are fed at the same time.

Furthermore, a timing for supply of the impurity raw material D is not limited to that T1 at which supply of the crystal raw materials A and B is to be started, but it may be that after the timing T1 at which supply of the crystal raw materials A and B is to be started.

Point is in that supply of the impurity raw materials D and E should be made simultaneously with or after supply of the crystal raw materials A and B, and before supply of the crystal raw material C with close timings.

In reference to a crystal structure formed in accordance with the timings indicated in FIG. 5, a layer 702 composed of the crystal raw materials A and B is deposited on a substrate 100 as a result of feeding the crystal raw materials A and B for the period of time $T_A$ from the timing T1 as illustrated in FIG. 6.

In this occasion, it may be considered that doping with the impurity raw materials D and E is made in the layer 702 composed of the crystal raw materials A and B as a result of supplying the impurity raw materials D and E, so that a kind of impurity pair (D-E) is formed.

Then, a layer 704 composed of the crystal raw material C is laminated on the layer 702 composed of the crystal raw materials A and B doped with the impurity raw materials D and E as a result of feeding the crystal raw material C for a period of time $T_B$ starting from the timing T2.

Besides, when a desired number of times of the above-described one cycle (see FIG. 5) is repeated, lamination of the layer 702 composed of the crystal raw materials A and B doped with the impurity raw materials D and E, and the layer 704 composed of the crystal raw material C is repeated in response to the number of times of repeated cycles, whereby a crystal having a desired thickness W is formed, so that the resulting crystal can be used for a p-type semiconductor material.

In the above-described first and second manners, it is preferred to supply continuously a small amount of N at a degree due to which quality of a crystal is not decreased for the sake of suppressing elimination of N from a surface of AlGaN during stoppage of feeding N for the crystal raw material C in the case where gallium (Ga) is used for the crystal raw material A, aluminum (Al) is used for the crystal raw material B, nitrogen (N) is used for the crystal raw material C, magnesium (Mg) is used for the impurity raw material D, and silicon (Si) is used for the impurity raw material E, whereby layers of AlGaN crystal are formed on a substrate.

In the following, a case where layers of AlGaN crystal are formed on a substrate as a p-type semiconductor crystal (a p-type semiconductor material) in accordance with the above-described first and second manners will be described by referring to FIGS. 7 through 13.

Figure 7:
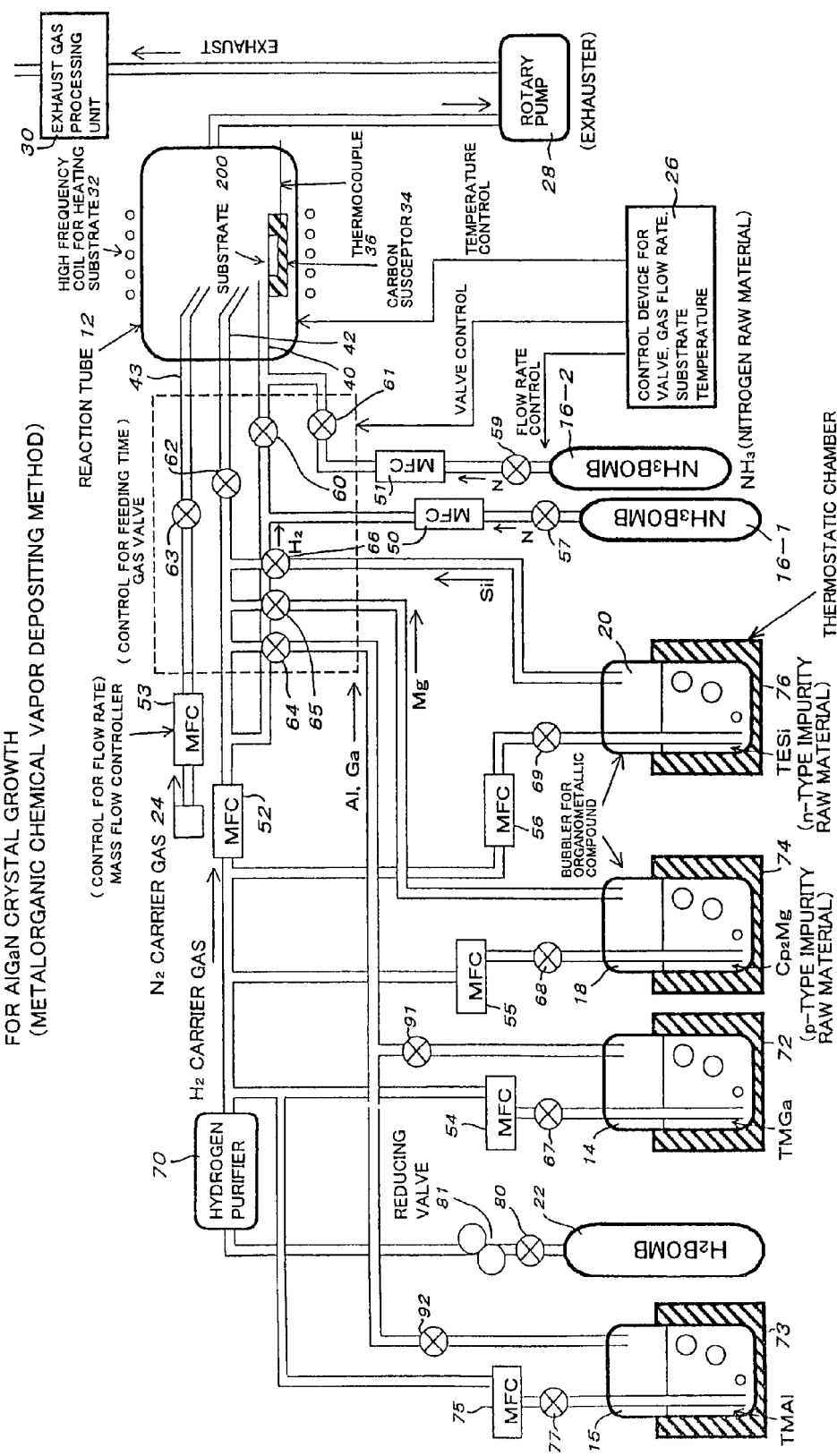
FIG. 7 is a schematic, constitutional, explanatory diagram illustrating an apparatus for metalorganic chemical vapor deposition (MOCVD) which can be used for an apparatus for forming layers of AlGaN crystal as a semiconductor material in accordance with the first and second manners.

FIG. 7 is a schematic, constitutional, explanatory diagram showing an apparatus for metalorganic chemical vapor deposition (MOCVD) which can be used for forming layers of AlGaN crystal as a p-type semiconductor material in accordance with the above-described first and second manners.

Figure 8:
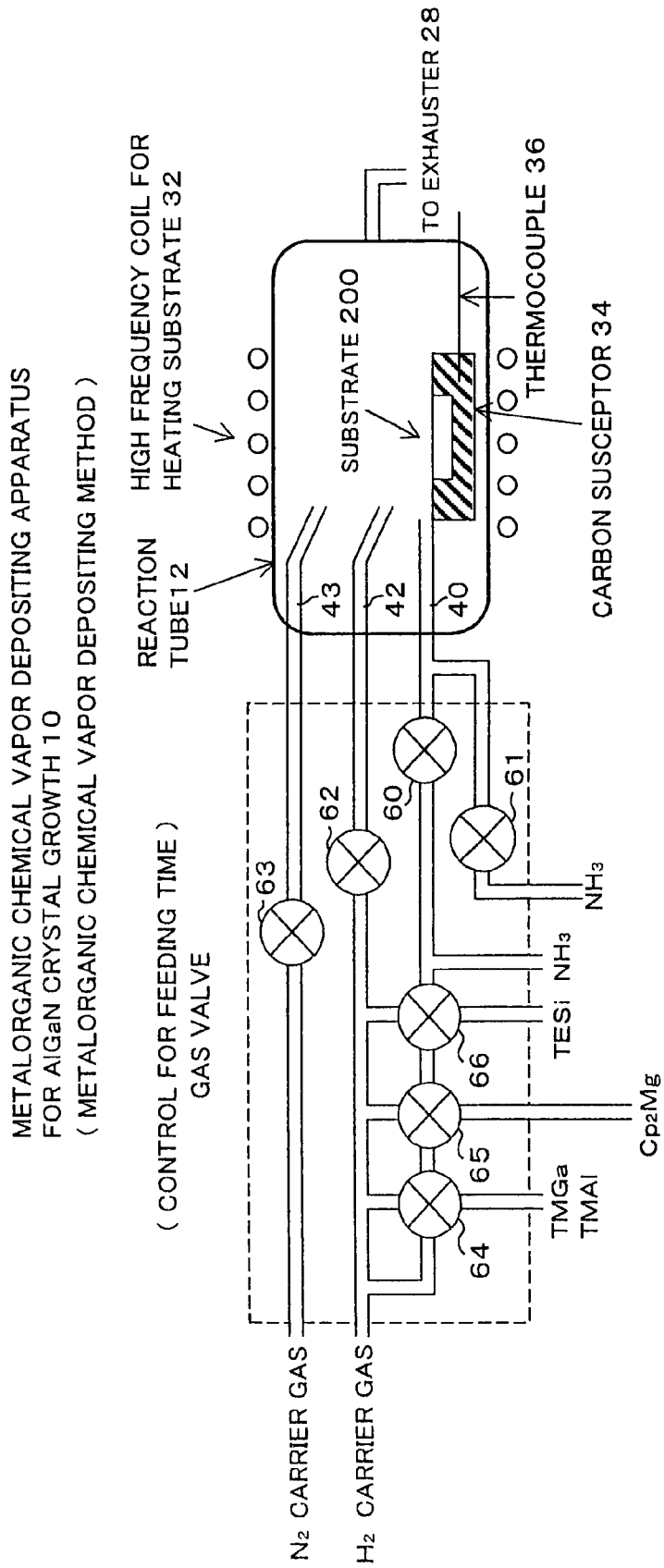
FIG. 8 is a schematic, constitutional, explanatory view showing an essential part of FIG. 7.
Figure 9:
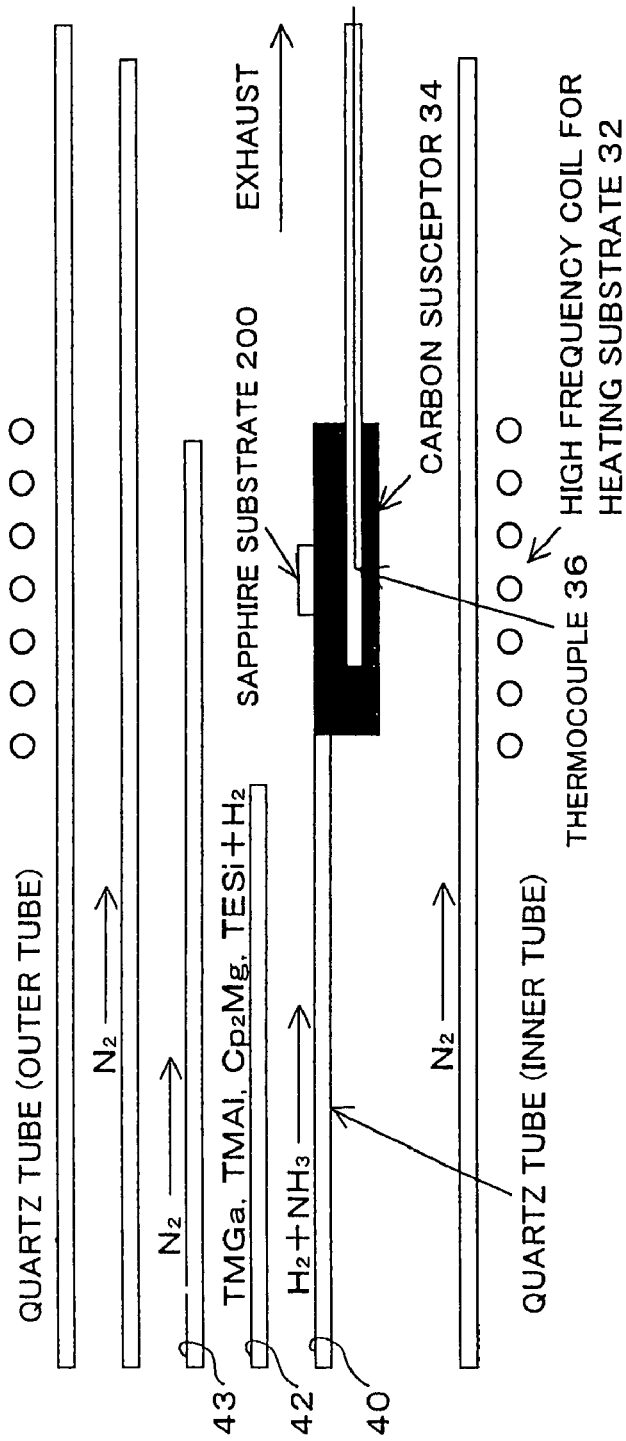
FIG. 9 is a schematic, constitutional, explanatory diagram illustrating a reaction tube of FIG. 7.
Figure 10:
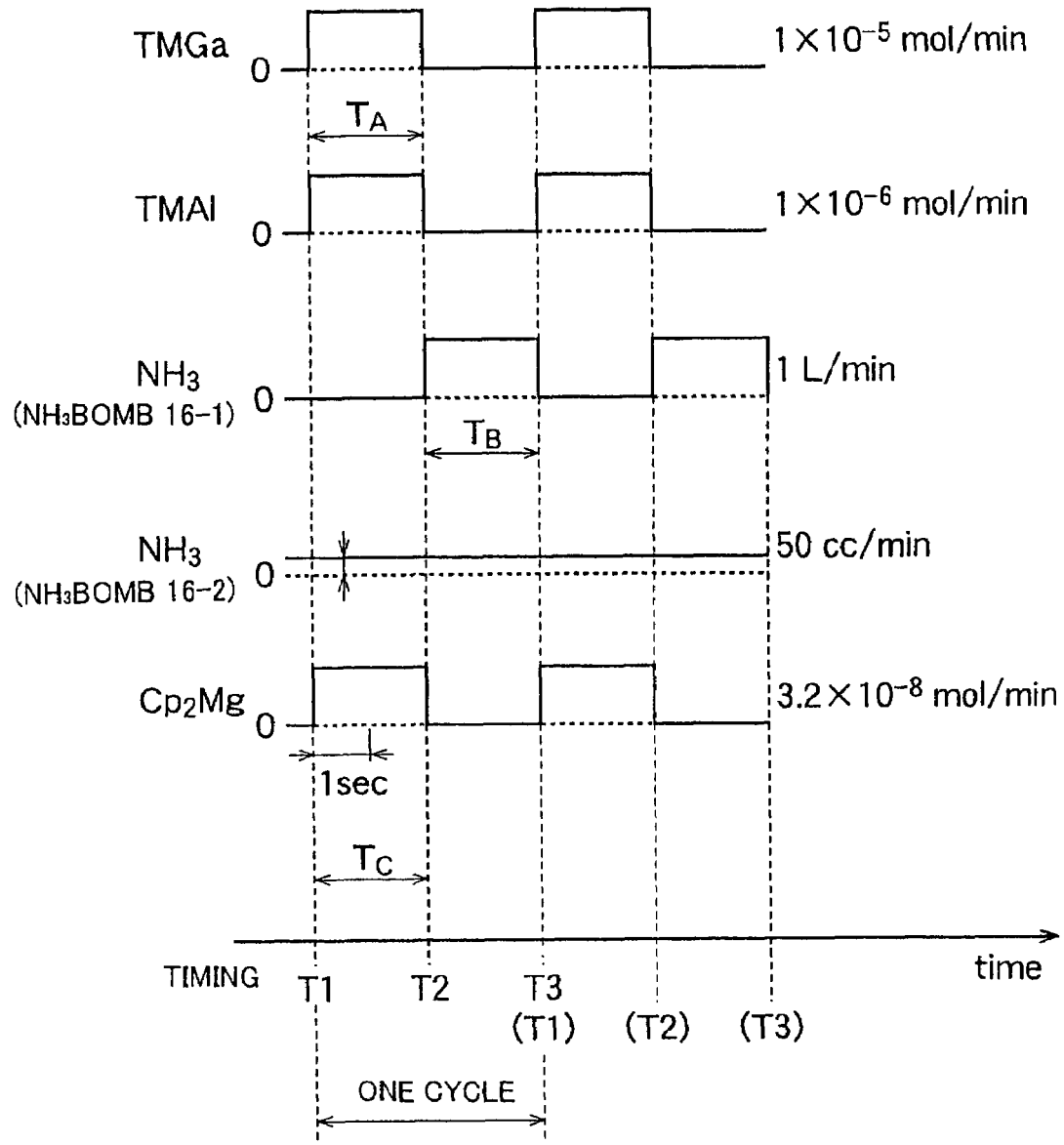
FIG. 10 is a timing chart showing an example of timing for feeding crystal raw materials and an impurity raw material in case of forming AlGaN crystal, i.e. an example of a sequence of pulses for feeding the raw materials in case of forming AlGaN as a semiconductor material in accordance with the first manner.
Figure 11:
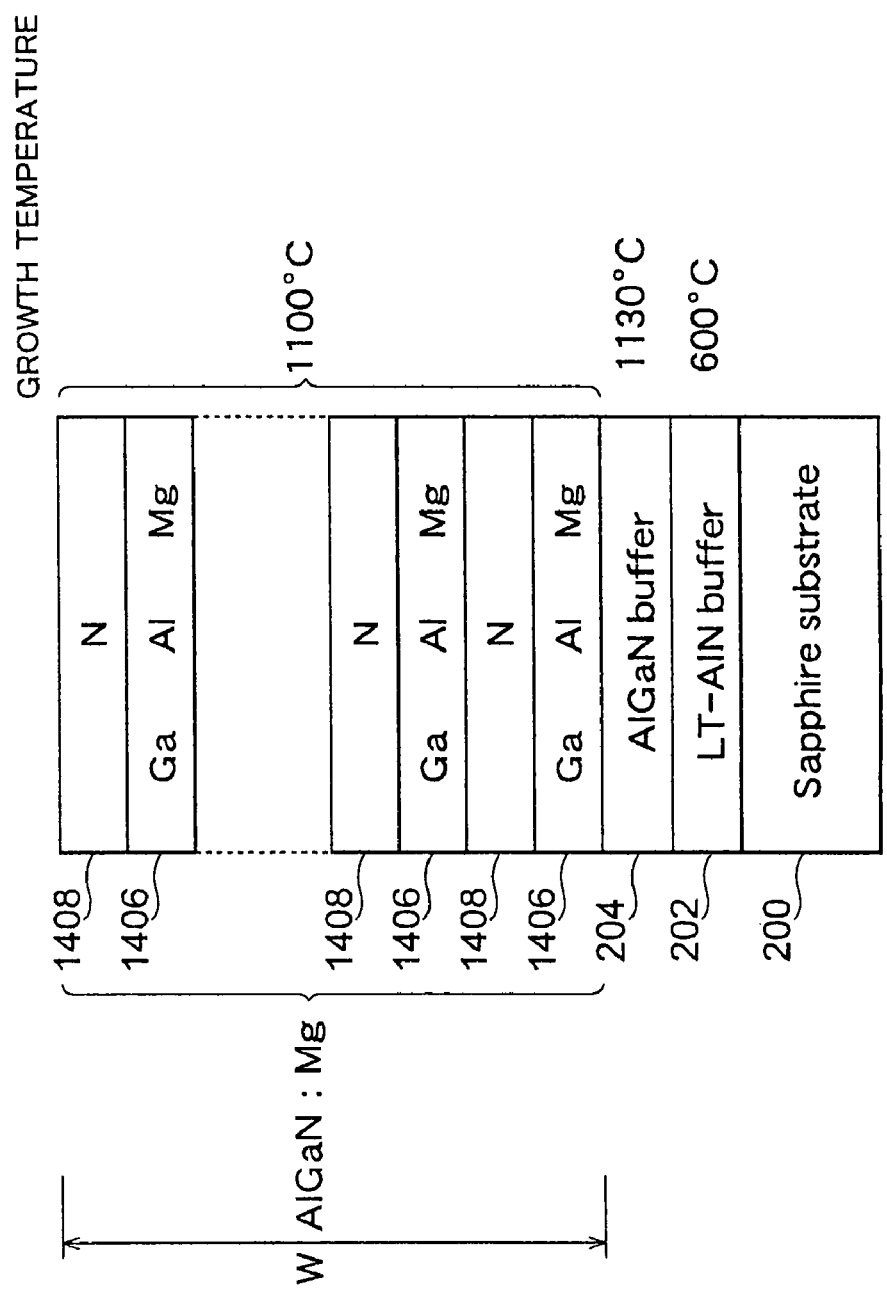
FIG. 11 is an explanatory view illustrating diagrammatically a crystal structure of AlGaN formed on the basis of a sequence of pulses for feeding raw materials in case of forming AlGaN shown in FIG. 10 in accordance with the first manner.
Figure 12:
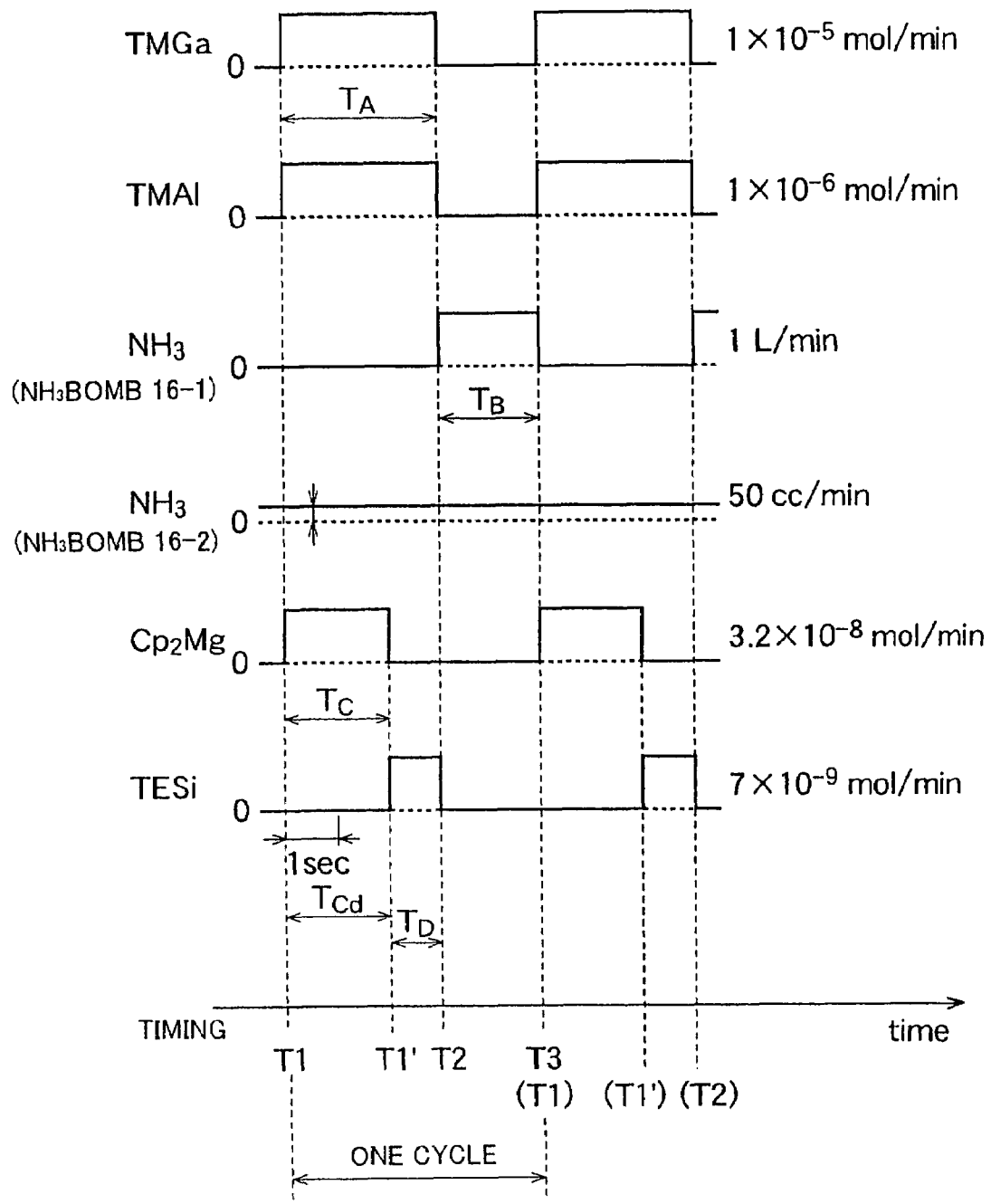
FIG. 12 is a timing chart showing an example of timing for feeding crystal raw materials and impurity raw materials in case of forming AlGaN crystal, i.e. an example of a sequence of pulses for feeding the raw materials in case of forming AlGaN as a semiconductor material in accordance with the second manner.
Figure 13:
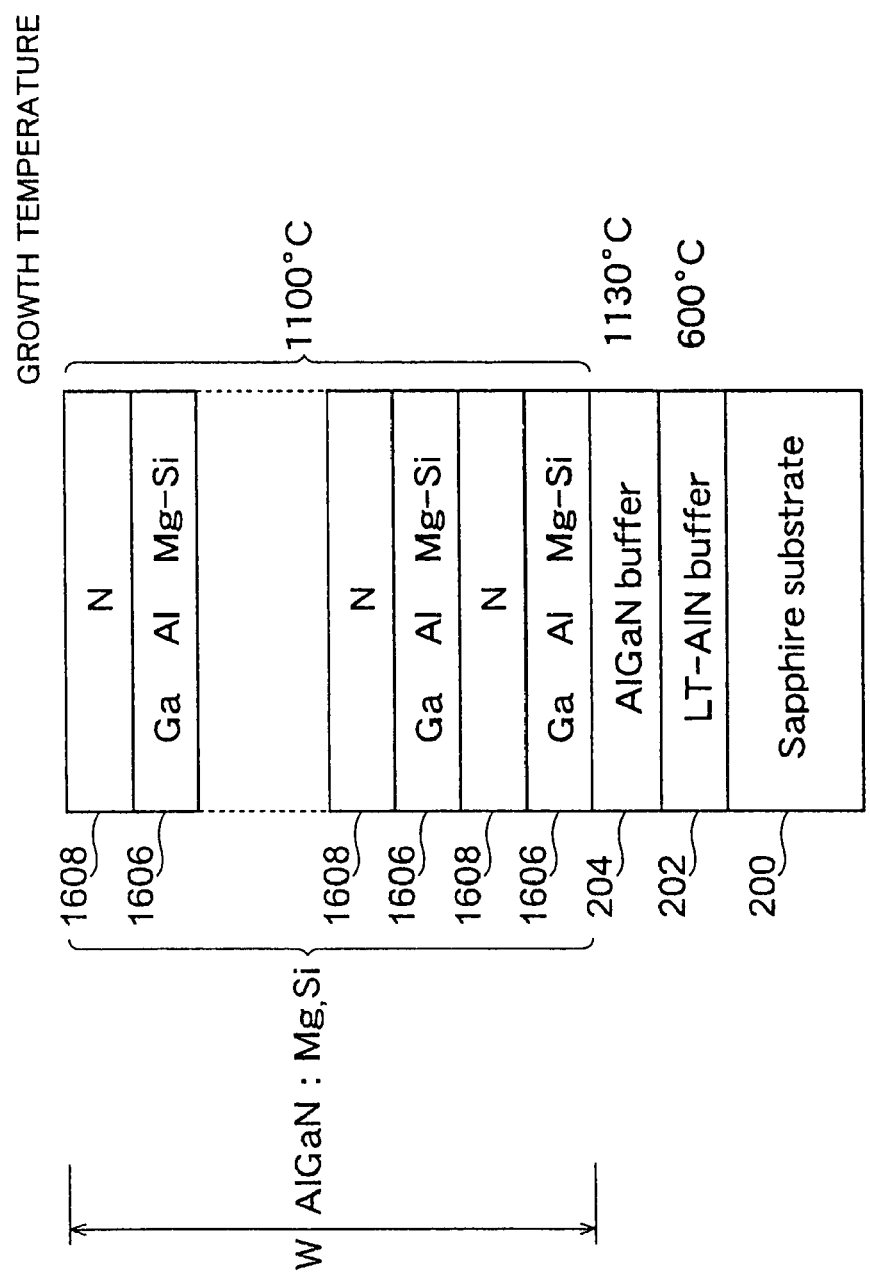
FIG. 13 is an explanatory view illustrating diagrammatically a crystal structure of AlGaN formed on the basis of a sequence of pulses for feeding raw materials in case of forming AlGaN shown in FIG. 12 in accordance with the second manner.

Moreover, FIG. 8 is a schematic, constitutional, explanatory view showing an essential part of FIG. 7, FIG. 9 is a schematic, constitutional, explanatory diagram illustrating a reaction tube of FIG. 7, FIG. 10 is a timing chart showing an example of timings for feeding crystal raw materials and an impurity raw material in case of forming a p-type AlGaN crystal, i.e. an example of sequences of pulses for feeding the raw materials in case of forming a p-type AlGaN as a semiconductor material in accordance with the first manner, FIG. 11 is an explanatory view illustrating diagrammatically a crystal structure of p-type AlGaN formed on the basis of sequences of pulses for feeding raw materials in case of forming AlGaN shown in FIG. 10 in accordance with the first manner, FIG. 12 is a timing chart showing an example of timings for feeding crystal raw materials and impurity raw materials in case of forming a p-type AlGaN crystal, i.e. an example of sequences of pulses for feeding the raw materials in case of forming p-type AlGaN as a semiconductor material in accordance with the second manner, and FIG. 13 is an explanatory view illustrating diagrammatically a crystal structure of p-type AlGaN formed on the basis of sequences of pulses for feeding raw materials in case of forming AlGaN shown in FIG. 12 in accordance with the second manner.

In the following description, when a p-type AlGaN crystal is deposited for a semiconductor material in accordance with the first manner, trimethyl gallium (TMGa) is used as a raw material gas of gallium (Ga) being a crystal raw material, trimethyl aluminum (TMAl) is used as a raw material gas of aluminum (Al) being a crystal raw material, ammonia ($NH_3$) is used as a raw material gas of aluminum (Al) being a crystal raw material, and biscyclopentadienyl magnesium ($Cp_2Mg$) is used as a raw material gas of magnesium (Mg) being an impurity material (p-type impurity raw material) for doping use, respectively.

More specifically, biscyclopentadienyl magnesium ($Cp_2Mg$) is used for a magnesium (Mg) raw material as an impurity of p-type AlGaN.

Moreover, tetraethylsilane (TESi) is used for a raw material gas of silicon (Si) being an impurity material (n-type impurity raw material) for doping use in addition to the crystal raw materials and the impurity raw material used in the above-described first manner in case of forming a p-type AlGaN crystal as a semiconductor material in accordance with the second manner.

Namely, tetraethyl silane (TESi) is used for a silicon (Si) raw material as an n-type AlGaN impurity.

First, an outline of the MOCVD apparatus (MOCVD apparatus for deposition of AlGaN crystal) 10 shown in FIG. 7 will be explained. The MOCVD apparatus 10 is composed of a horizontal-type reaction tube 12 inside which a substrate 200 is disposed, a bubbler 14 for retaining trimethyl gallium (TMGa), a bubbler 15 for retaining trimethyl aluminum (TMAl), $NH_3$ bombs 16-1 and 16-2 for retaining ammonia ($NH_3$) gas, respectively, a bubbler 18 for retaining biscyclopentadienyl magnesium ($CP_2Mg$), a bubbler 20 for retaining tetraethylsilane (TESi), an $H_2$ bomb 22 for retaining hydrogen ($H_2$) gas being a carrier gas, an $N_2$ bomb 24 for retaining nitrogen ($N_2$) gas being a carrier gas, a control device 26 for implementing a variety of controlling operations (for example, control for opening and closing the undermentioned various gas valves or pressure reducing valves, control for the undermentioned various mass flow controllers used for setting flow rates of various gases to be introduced into the reaction tube 12 to predetermined values, respectively, and control for temperatures of the substrate 200 by means of control in energization of high-frequency current upon the undermentioned high-frequency coil 32 for heating substrate, a rotary pump 28 used for an exhauster for exhausting the interior of the reaction tube 12, and an exhaust gas processing unit 30 for processing the exhaust gas from the rotary pump 28.

A high-frequency coil 32 for heating substrate is wound around an outer periphery of the reaction tube 12. Further, inside the reaction tube 12, a carbon susceptor 34 for supporting the substrate 200 is disposed, and further a thermocouple 36 to be attached to the carbon susceptor 34 is placed.

Namely, the high-frequency coil 32 for heating substrate is energized with high-frequency current to heat the carbon susceptor 34, whereby the substrate 200 disposed on the carbon susceptor 34 is heated to a predetermined temperature in the MOCVD apparatus 10.

A temperature of the carbon susceptor 34 is monitored by means of the thermocouple 36, and then, high-frequency current for energizing the high-frequency coil 32 for heating substrate is controlled by the control device 26 on the basis of results of the above-described monitoring, whereby a temperature of the substrate 200 is controlled in such that the substrate 200 is heated to a predetermined temperature.

Moreover, the reaction tube 12 is provided with a quartz pipe 40 for feeding $NH_3$ gas from the $NH_3$ bombs 16-1 and 16-2 to the inside thereof, a quartz pipe 42 for feeding $H_2$ gas from the $H_2$ bomb 22 as a carrier gas, and a quartz pipe 43 for feeding $N_2$ gas from $N_2$ bomb 24 as a carrier gas, respectively.

It is arranged in such that when gas valves 57, 59, 60, and 61 are opened respectively, the $NH_3$ gas retained in the $NH_3$ bombs 16-1 and 16-2 is fed together with $H_2$ gas into the reaction tube 12 through the quartz pipe 40 at each flow rate which has been set to a predetermined value by means of the mass flow controllers (MFC) 50 and 51, respectively.

Furthermore, it is arranged in such that when gas valves 67, 77, 68, and 69 are opened, the $H_2$ gas retained in the $H_2$ bomb 22 is delivered from a hydrogen purifier 70 through a gas valve 80 and a pressure reducing valve 81, and fed to the bubblers 14, 15, 18, and 20 at each flow rate which has been set to a predetermined value by means of MFC 54, 75, 55, and 56, respectively.

The bubblers 14, 15, 18, and 20 are placed in thermostatic chambers 72, 73, 74, and 76, respectively, and when gas valves 64, 65, 66, 91, and 92 are opened together with a gas valve 62, TMGa, TMAl, $Cp_2Mg$, and TESi which have been retained in the bubblers 14, 15, 18, and 20, respectively, besides, maintained at each predetermined temperature are fed together with a $H_2$ carrier gas at a gas flow rate which has been set to a predetermined value by means of the MFC 52 into the reaction tube 12 through the quartz pipe 42, respectively.

On one hand, when a gas valve 63 is opened, the $N_2$ gas retained in the $N_2$ bomb 24 is supplied at a gas flow rate which has been set to a predetermined value by means of MFC 53 into the reaction tube 12 through the quartz pipe 43.

Control for gas flow rates by the MFCs 50, 51, 52, 53, 54, 75, 55, and 56 as well as control for opening and closing the gas valves 57, 59, 60, 61, 62, 63, 64, 65, 66, 67, 77, 68, 69, 80, 91, 92, and the pressure reducing valve 81 are made by means of the control device 26.

With the above-described constitution, a pressure inside the reaction tube 12 (internal pressure) is reduced to 76 Torr (0.1 atmospheric pressure), a mixed gas prepared by mixing hydrogen at a flow rate of 5 slm with nitrogen at a flow rate of 2 slm is used for a carrier gas, raw material gases of the above-described respective raw materials are introduced to the reaction tube 12 by the use of the carrier gas, and crystal growth is made on the substrate 200, whereby AlGaN crystal is deposited in accordance with the first and second manners in the MOCVD apparatus 10.

It is to be noted that a sapphire substrate (0001) plane is used for the substrate 200, so that a terminology "sapphire substrate" 200 is used in the following description.

The first and second manners are described, respectively, in detail hereinafter.

First, the first manner will be described. In order to clean the sapphire substrate 200 disposed on the carbon susceptor 34 before crystal growth, such cleaning operation that the sapphire substrate 200 is heated in hydrogen gas at 1200° C. for ten minutes to remove an oxide film on the surface of the sapphire substrate 200 is made.

Then, an AlN low temperature buffer layer (LT-AlN buffer) 202 is deposited on the sapphire substrate 200 placed on the carbon susceptor 34 at 600° C. for three minutes in accordance with a well-known technique, thereafter, the temperature is raised to 1130° C., and a non-doped AlGaN buffer layer (AlGaN buffer) 204 which has not been doped with impurity raw materials of magnesium and silicon is grown by continuous feeding of crystal raw materials in accordance with a well-known technique (see FIG. 11).

Crystal raw materials and an impurity raw material were alternately fed on the AlGaN buffer layer 204 thus deposited in accordance with the first manner to make crystal growth of p-type AlGaN (see FIG. 11).

More specifically, a pressure inside the reaction tube 12 (internal pressure) is reduced to 76 Torr (0.1 atmospheric pressure), and a temperature of the sapphire substrate 200 placed on the carbon susceptor 34 is heated to 1100° C.

Furthermore, the MFCs 50, 51, 52, and 53 are controlled by means of the control device 26, whereby a flow rate of the $NH_3$ gas supplied from the $NH_3$ bomb 16-1 is controlled to one liter/minute (L/min), a flow rate of the $NH_3$ gas supplied from the $NH_3$ bomb 16-2 is controlled to fifty cc/minute (cc/min), a flow rate of the $H_2$ gas supplied from the $H_2$ bomb 22 is controlled to two to five liter/minute, and a flow rate of the $N_2$ gas supplied from the $N_2$ bomb 24 is controlled to one to three liter/minute, respectively.

Namely, for the sake of making a time for switching gases to be fed (They are TMGa gas for supplying Ga as a raw material gas (crystal raw material), TMAl gas for supplying Al as a crystal raw material, $NH_3$ gas for supplying N as a crystal raw material, and $Cp_2Mg$ gas for supplying Mg as an impurity raw material.) is to be 0.1 second or less, an internal pressure inside the reaction tube 12 is reduced to 0.1 atmospheric pressure, and it is preferred that each flow rate of a variety of raw material gases is several meter/second.

In order to prevent degradation in quality of the crystal deposited as a result of re-evaporating nitrogen atoms from the AlGaN crystal deposited during stoppage of supply of $NH_3$ gas from the $NH_3$ bomb 16-1, a low flow rate (fifty cc/minute) of $NH_3$ gas is continuously supplied from the $NH_3$ bomb 16-2.

In case of forming AlGaN crystal in accordance with the first manner, the gas valves 66 and 69 are closed to stop supply of TESi to the reaction tube 12, while the gas valves 65 and 68 are opened to permit supply of $Cp_2Mg$ to the reaction tube 12. A flow rate of $Cp_2Mg$ is controlled to $3.2 \times 10^{-8}$ mole/minute (mol/min) by means of the MFC 55.

As shown in FIG. 10, TMGa and TMAl are supplied alternately in every two seconds (sec) to form AlGaN crystal. In this case, the MFCs 58 and 77 are controlled by means of the control device 26, whereby a flow rate of the TMGa fed from the bubbler 18 is controlled to $1 \times 10^{-5}$ mole/minute (mol/min), while a flow rate of the TMAl fed from the bubbler 15 is controlled to $1 \times 10^{-6}$ mole/minute (mol/min). Further, TMGa as well as TMAl, and $NH_3$ are supplied alternately in every two seconds to form AlGaN crystal. In this case, $Cp_2Mg$ of a p-type impurity raw material is supplied at the same time of supply for TMGa and TMAl.

More specifically, first, supply of TMGa and TMAl as well as $Cp_2Mg$ is commenced at a timing T1.

Then, TMGa and TMAl are supplied for two seconds (a period of time $T_A$), at the same time, $Cp_2Mg$ is supplied for two seconds (a period of time $T_C$) equal to the period of time $T_A$, and supply of TMGa, TMAl, and $Cp_2Mg$ is completed at a timing T2.

Thereafter, supply of $NH_3$ is started immediately after the timing T2, the $NH_3$ is supplied for two seconds (a period of time $T_B$), and supply of the $NH_3$ is finished at a timing T3.

As described above, processing for one cycle is completed, the timing T3 is considered to be another timing T1, and the following cycle is started.

When a desired number of times of such cycle as described above are repeated, an AlGaN crystal having a desired film thickness can be obtained.

A structure of AlGaN crystal formed in accordance with the timings shown in FIG. 10 is the one wherein a layer 1406 composed of Ga and Al is formed on an AlGaN buffer layer 204 deposited on the sapphire substrate 200 by means of supply of TMGa and TMAl for two seconds (the period of $T_A$) from the timing T1 as shown in FIG. 11.

In this case, the inside of the layer 1406 composed of Ga and Al is doped with Mg being a p-type impurity raw material as a result of feeding Mg in $Cp_2Mg$ being another p-type impurity raw material.

Thereafter, a layer 1408 composed of N is laminated on the layer 1406 composed of Ga and Al doped with Mg as a result of supply of $NH_3$ from the timing T2 (a period of time $T_B$).

As described above, one cycle for feeding TMGa, TMAl, $NH_3$ and $Cp_2Mg$ becomes four seconds (see FIG. 10). When a desired number of times of the one cycle are repeated, lamination of the layer 1406 composed of Ga and Al and doped with Mg as well as the layer 1408 composed of N is repeated in response to a number of times of repeated cycles, whereby an AlGaN crystal having a desired thickness W is formed. The resulting AlGaN crystal can be used for a semiconductor material.

Figure 14:
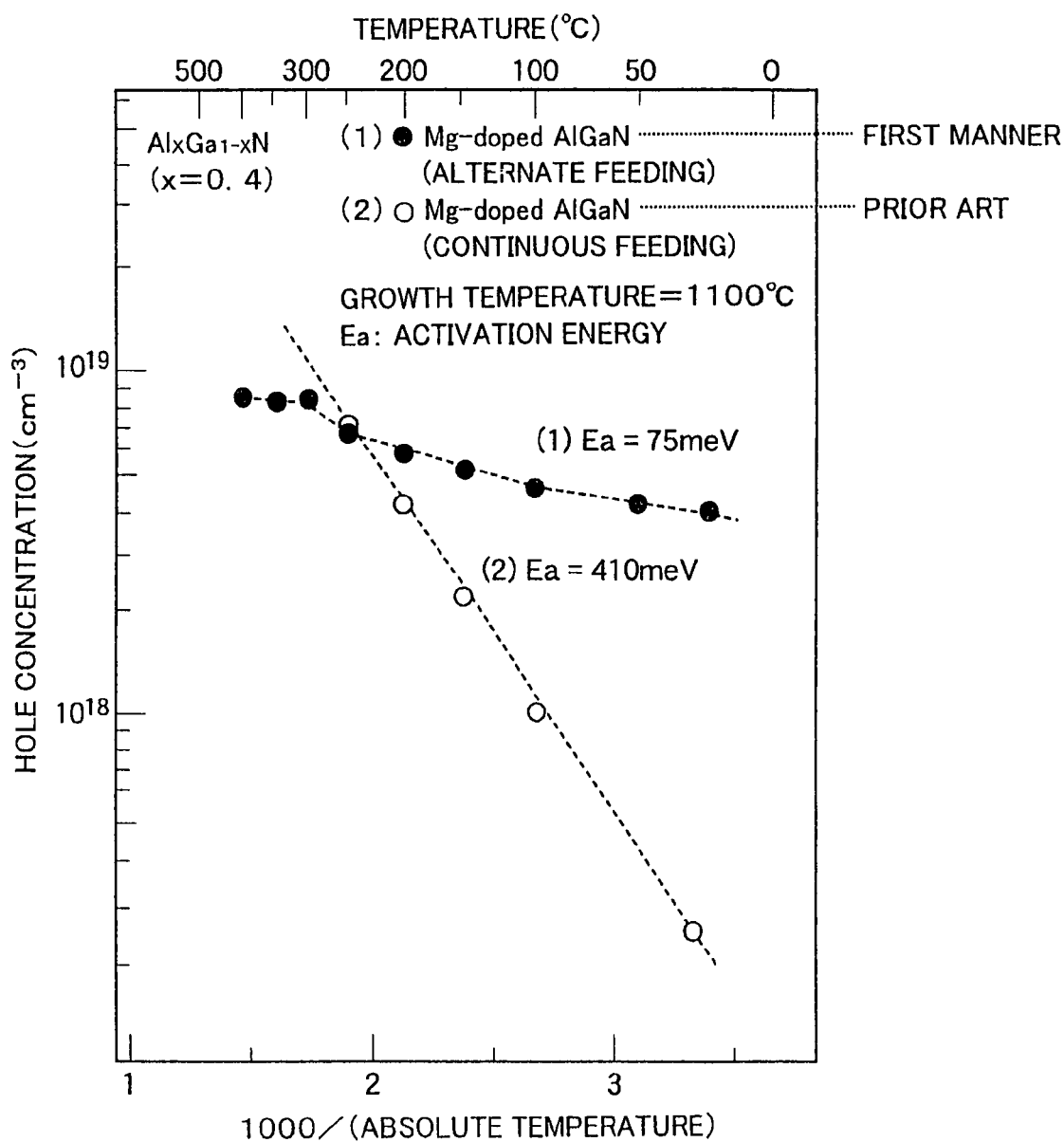
FIG. 14 is a graphical representation indicating results of estimation for AlGaN crystals prepared by the present inventors in accordance with constitutions and conditions of the apparatus shown in FIGS. 7 through 10 (the first manner) wherein temperature dependence of hole concentrations between AlGaN doped with Mg prepared in accordance with the first manner and AlGaN doped with Mg in accordance with a conventional technique is shown, respectively.

FIG. 14 is a graphical representation indicating results of estimation for p-type AlGaN crystal prepared by the present inventors in accordance with constitutions and conditions of the apparatus shown in FIGS. 7 through 10 (the first manner).

In other words, FIG. 14 indicates hole concentrations of AlGaN doped with Mg in a temperature range of from 20° C. to 400° C.

In FIG. 14, a case (1) indicates temperature dependence of hole concentration in case of subjecting the AlGaN doped with Mg to crystal growth by means of alternate feeding of raw materials in accordance with the first manner, while a case (2) indicates temperature dependence of hole concentration in case of subjecting the AlGaN doped with Mg to crystal growth by means of a continuous feeding of raw materials in accordance with a conventional technique.

With respect to hole concentration in the vicinity of room temperature, a hole concentration of AlGaN which has been subjected to crystal growth by means of alternate feeding of raw materials in accordance with the first manner is $4 \times 10^{18}$ $cm^{-3}$ which is about sixteen times higher than $2.5 \times 10^{17}$ $cm^{-3}$ being hole concentration of AlGaN which has been subjected to crystal growth by means of continuous feeding of raw materials in accordance with a conventional technique.

Furthermore, when hole mobility in the vicinities of room temperature is compared, hole mobility of AlGaN which has been subjected to crystal growth by means of alternate feeding of raw materials in accordance with the first manner is 1.5 $cm^2 V^{-1} s^{-1}$ which is about three times higher than 0.5 $cm^2 V^{-1} s^{-1}$ being hole mobility of AlGaN which has been subjected to crystal growth by means of continuous feeding of raw materials in accordance with a conventional technique.

Accordingly, with respect to electric conductivity which is a product of hole concentration and hole mobility, the product of AlGaN which has been subjected to crystal growth by means of alternate feeding of raw materials in accordance with the first manner is about forty eight times higher than that of AlGaN which has been subjected to crystal growth by means of continuous feeding of raw materials in accordance with a conventional technique.

Moreover, activation energy of Mg acceptor is determined from temperature changes in hole concentration shown in FIG. 14, so that activation energy of AlGaN which has been subjected to crystal growth by means of alternate feeding of raw materials in accordance with the first manner was 75 meV.

On one hand, activation energy of Mg was 410 meV with respect to AlGaN which has been subjected to crystal growth by means of continuous feeding of raw materials in accordance with a conventional technique, and 410 meV is substantially coincident with a value which has been known heretofore.

As a result of measurement of Mg in AlGaN by means of SIMS analysis, Mg density is about $5 \times 10^{18}$ $cm^{-3}$, and this Mg density is lower by around one digit than that of AlGaN which has been subjected to crystal growth by means of continuous feeding of raw materials in accordance with a conventional technique. However, since activation energy of Mg is small, most of Mg introduced is activated so that high hole concentration is obtained.

In the case when GaN is doped with Mg, it was possible to achieve doping of Mg by such a manner that $NH_3$ was continuously fed, while TMG and $Cp_2Mg$ were fed in a pulsed manner. In the case where AlGaN is doped with Mg, alternate feeding of raw materials in accordance with the second manner wherein $Cp_2Mg$ is fed during stoppage of $NH_3$.

Next, the second manner will be described hereunder. When an AlGaN crystal is formed in accordance with the second manner, gas valves 65, 66, 68, and 69 are opened, whereby supply of $Cp_2Mg$ and TESi to the reaction tube 12 is allowed. A flow rate of $Cp_2Mg$ is controlled to $3.2 \times 10^{-8}$ mole/minute (mol/min) by means of an MFC 55, while a flow rate of TESi is controlled to $7 \times 10^{-9}$ mole/minute (mol/min) by means of an MFC 56.

In the second manner also, TMGa as well as TMAl and $NH_3$ are supplied alternately as in the case of the first manner. More specifically, supply of TMGa and TMAl for three seconds and supply of $NH_3$ for two seconds are alternately implemented, whereby an AlGaN crystal is formed. In this case, $Cp_2Mg$ being a p-type impurity raw material is started to feed the same at the same time of TMGa and TMAl for only two seconds, while TESi being an n-type impurity raw material is fed after supply of $Cp_2Mg$ for only one second.

More specifically, first, supply of TMGa as well as TMAl and $Cp_2Mg$ is commenced at a timing T1.

Then, TMGa and TMAl are supplied for three seconds (a period of time $T_A$), and at the same time, $Cp_2Mg$ is supplied for two seconds (a period of time $T_C$) which is shorter than the period of time $T_A$. Thereafter, supply of $Cp_2Mg$ is finished at a timing T1'.

Then, supply of TESi is started immediately after the timing T1' at which supply of $Cp_2Mg$ is to be finished, the TESi is supplied for one second (a period of time $T_D$), and supply of TESi and supply of TMGa as well as TMAl are finished at a timing T2.

On one hand, supply of $NH_3$ is commenced immediately after the timing T2, $NH_3$ is supplied for two seconds (the period of time $T_D$), and supply of $NH_3$ is finished at the timing T3.

As described above, processing for one cycle is completed, the timing T3 is considered to be another timing T1, and the following cycle is started.

When a desired number of times for such cycle as described above are repeated, an AlGaN crystal having a desired film thickness can be obtained as a semiconductor material.

In a structure of the AlGaN crystal formed in accordance with the timing indicated in FIG. 12, a layer 1606 composed of Ga and Al is formed on the AlGaN buffer layer 206 deposited on the sapphire substrate 200 as a result of feeding TMGa and TMAl for two seconds (the period of time $T_A$) from the timing T1 as shown in FIG. 13.

In this case, as a result of feeding $Cp_2Mg$ being a p-type impurity raw material and TESi being an n-type impurity raw material, doping of Mg and Si is made inside the layer composed of Ga and Al, so that a kind of impurity pair (Mg—Si) is formed from Mg being a p-type impurity raw material and Si being an n-type impurity raw material.

Thereafter, a layer 1608 composed of N is laminated on the layer composed of Ga and Al which have been doped with Mg and Si, respectively, as a result of supplying $NH_3$ from the timing T2 (the period of time $T_B$).

As described above, one cycle wherein TMGa, TMAl, $NH_3$, $Cp_2Mg$, and TESi are supplied, respectively (see FIG. 12) comes to be five seconds. When a desired number of times of the one cycle are repeated, lamination of the layer 1606 composed of Ga and Al doped with Mg and Si, respectively, and the layer 1608 composed of N is repeated in response to a number of times for the cycles repeated to form an AlGaN crystal having a desired thickness W, and thus, the resulting AlGaN crystal may be used as a semiconductor material.

More specifically, as described above, when $Cp_2Mg$ being a raw material gas of Mg which is a p-type impurity raw material and TESi being a raw material gas of Si which is an n-type raw material are supplied at close timings in a pulsed manner at the same time of or after supply of TMGa being a raw material gas of a crystal raw material Ga and TMAl being a raw material gas of a crystal raw material Al, besides, before starting supply of $NH_3$ being a raw material gas of a crystal raw material N, doping is achieved inside the layer 1606 composed of Ga and Al doped with Mg and Al at a suitable ratio without incorporating disorderly Mg and Si into the layer.

As a consequence, positions of Mg and Si in the layer 1606 composed of Ga and Al doped with Mg and Si are controlled, so that Mg and Si are placed closely at a predetermined ratio inside the layer 1606 composed of Ga and Al doped with Mg and Al, whereby Mg and Si forms a kind of impurity pair, and an energy level of impurity, i.e. activation energy decreases.

Thus, a carrier concentration increases in the AlGaN crystal, so that a semiconductor material having high conductivity can be obtained.

Figure 15:
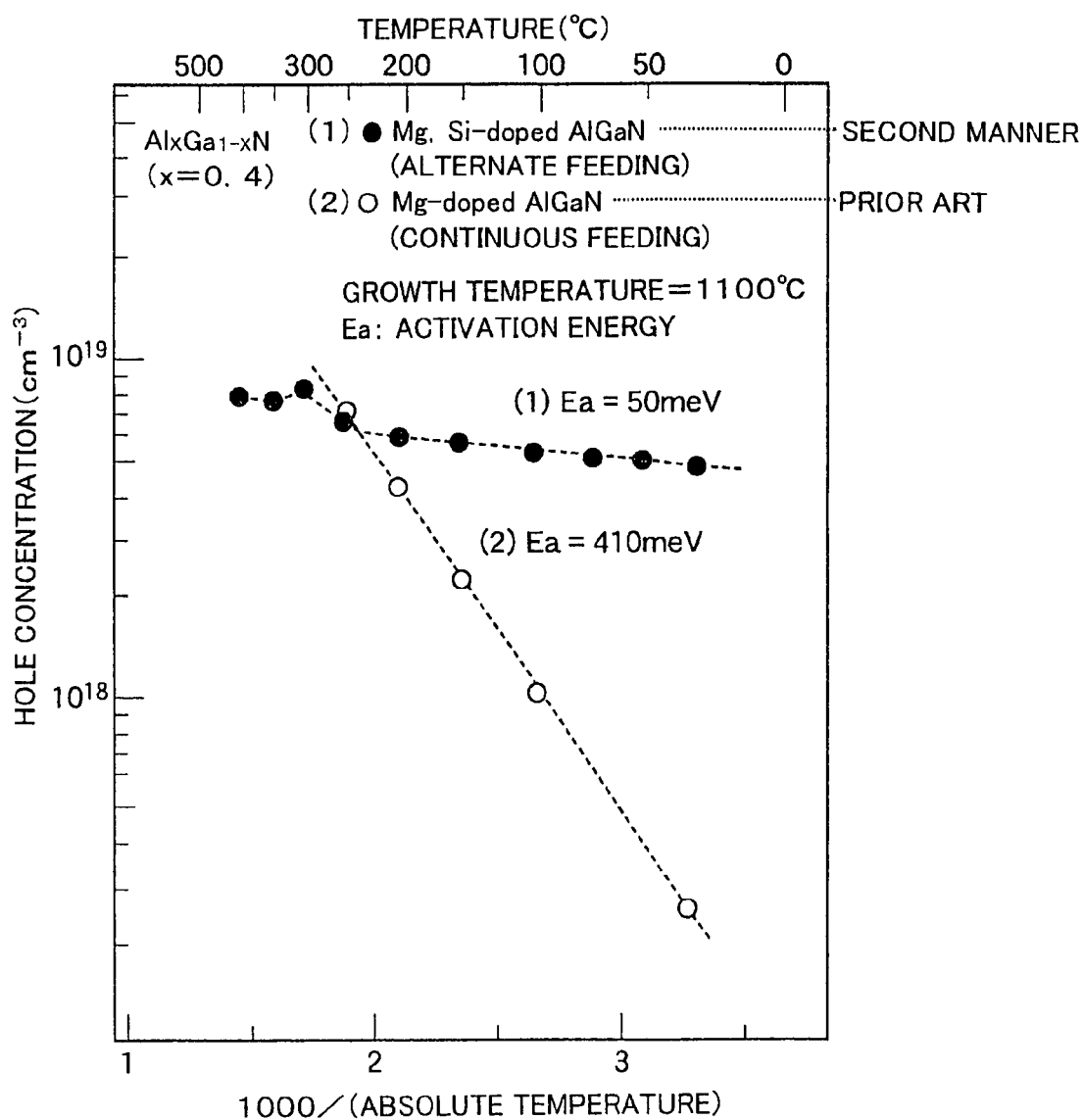
FIG. 15 is a graphical representation indicating results of estimation for AlGaN crystals prepared by the present inventors in accordance with constitutions and conditions of the apparatus shown in FIGS. 7, 8, 9, and 12 (the second manner) wherein temperature dependence of hole concentrations between AlGaN doped with Mg and Si prepared in accordance with the second manner and AlGaN doped with Mg in accordance with a conventional technique is shown, respectively.
Figure 16:
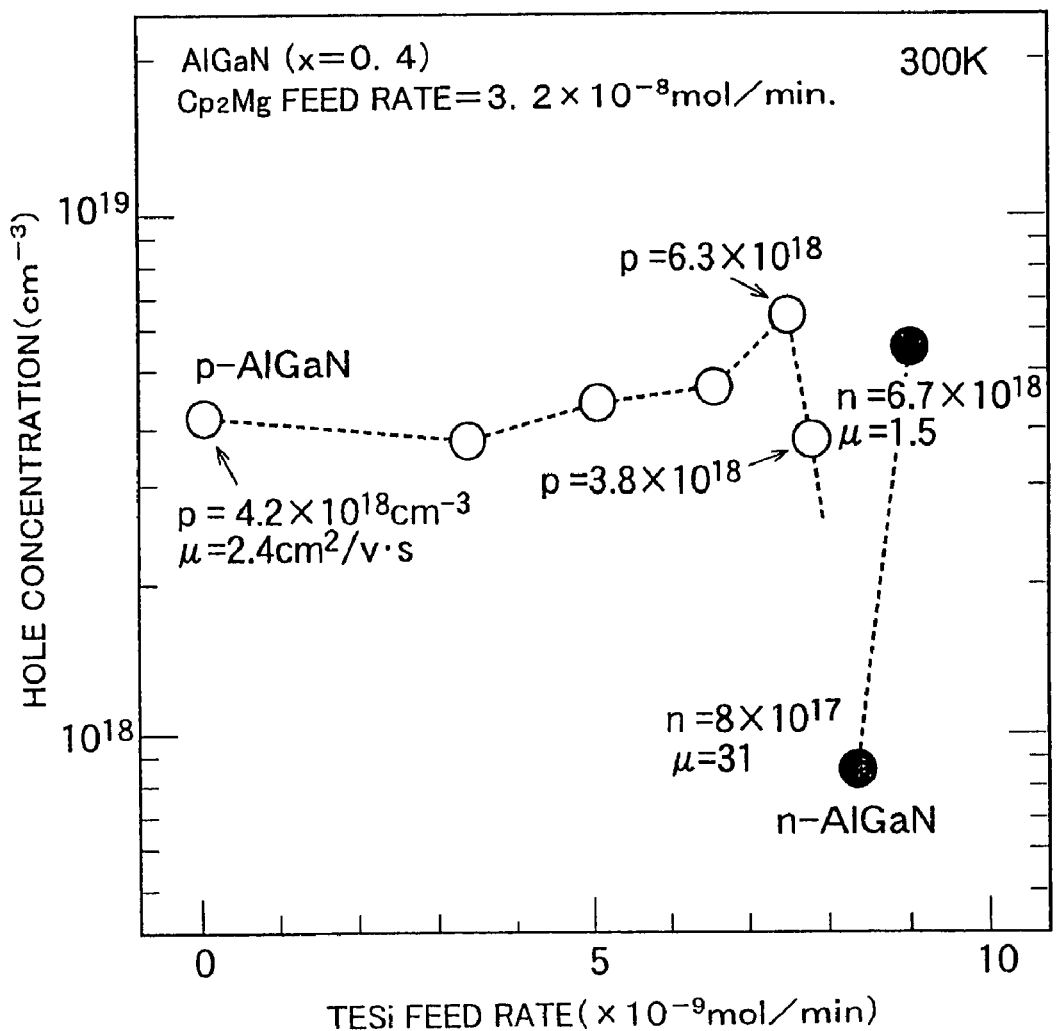
FIG. 16 is a graphical representation indicating dependence of feeding amount of Si in hole concentration of AlGaN doped with Mg and Si.

FIGS. 15 and 16 are graphical representations each indicating results of estimation for AlGaN crystal prepared by the present inventors in accordance with constitutions and conditions of the apparatus shown in FIGS. 7, 8, 9, and 12 (the second manner).

Namely, FIG. 15 is a graph indicating hole concentrations of p-type AlGaN doped with Mg and Si in a temperature range of from 20° C. to 400° C.

In FIG. 15, case (1) represents temperature dependence of hole concentration of a crystal which is obtained by subjecting the same to crystal growth by means of alternate supply of raw materials in accordance with the second manner, and from the resulting temperature change, activation energy of such acceptor was determined to be 50 meV.

On the other hand, case (2) in FIG. 15 represents temperature dependence of hole concentration of AlGaN doped with Mg which is obtained by subjecting the Al GaN doped with Mg to crystal growth by means of continuous supply of raw materials in accordance with a conventional technique, and from the resulting temperature change, activation energy of such Mg acceptor was determined to be 410 meV.

As mentioned above, activation energy of the AlGaN acceptor doped simultaneously with Mg and Si in accordance with the second manner is extremely low in comparison with that of the AlGaN acceptor doped with Mg prepared by continuous supply of raw materials in accordance with a conventional technique. In other words, the AlGaN doped simultaneously with Mg and Si in accordance with the second manner exhibits small activation energy even as compared with that of AlGaN doped with only Mg.

Furthermore, FIG. 16 is a graphical representation indicating carrier density of AlGaN at room temperature in the case where a feed rate of $Cp_2Mg$ is maintained at a constant value of $3.2\times10^{-8}$ mole/minute (mol/min), while a feed rate of TESi is changed. A hole concentration of p-type AlGaN containing only Mg prepared in the case where a feed rate of TESi is zero was $2\times10^{18}$ cm$^{-3}$, and its mobility was 2.4 cm$^2$ V$^{-1}$s$^{-1}$. In this case, when TESi is fed, its hole concentration decreases slightly, and when a feed rate of TESi is further increased, its hole concentration increases, resulting in the maximum value of $6.3\times10^{18}$ cm$^{-3}$, while its mobility exhibited 1.0 cm$^2$ V$^{-1}$s$^{-1}$.

Under the circumstances, a feed rate of TESi is further increased, hole concentration of p-type AlGaN decreased. Namely, the crystal changes into n-type AlGaN as indicated by black circles in a TESi feed rate of $8\times10^{-9}$ mole/minute (mol/min) or higher, so that its electron density was $8\times10^{17}$ cm$^{-3}$, and its mobility was 31 cm$^2$ V$^{-1}$s$^{-1}$. In case of a TESi feed rate of $9\times10^{-9}$ mole/minutes (mol/min), its electron density was $6.7\times10^{18}$ cm$^{-3}$, and its mobility was 1.5 cm$^2$ V$^{-1}$s$^{-1}$.

An electron density of n-type AlGaN doped only with Si was $4.2\times10^{18}$ cm$^{-3}$, and its mobility was 9.7 cm$^2$ V$^{-1}$s$^{-1}$. In comparison with this result, decrease in mobility was observed in n-type AlGaN wherein Mg and Si coexist.

As mentioned above, when Si is used for simultaneous doping with Mg, increase in hole concentration was observed in a narrow range of a TESi feed rate.

According to the first and second manners, a semiconductor crystal (semiconductor material) having high conductivity, particularly a p-type semiconductor material having positive hole of high density and high conductivity can be prepared as described above. Accordingly, it becomes possible to realize highly efficient pn junction, so that it can contribute to improvements in characteristics of semiconductor device, for example, increase in injection efficiency of pn junction, decrease in contact resistance of electrodes, decrease in series resistance and the like.

Furthermore, according to the first and second manners, even in a p-type semiconductor material having deep impurity level in forbidden band and high activation energy, decrease in activation energy is intended, whereby such p-type semiconductor material having positive hole of high density and high conductivity can be prepared.

Moreover, it is arranged in such that when plural types of crystal raw materials are supplied alternately in a pulsed manner at close timings, respectively, in accordance with the second manner, such supply is made at the same time or after commencement of supply for either of the crystal raw materials, besides, before commencement of supply for the other crystal raw materials. Accordingly, there is no disorderly incorporation of the plural types of impurities in atomic layers of crystals deposited from the crystal raw materials on a substrate, but doping is made with impurities at a suitable ratio. Hence, even when p-type impurity raw materials and n-type impurity raw materials are used, its carrier concentration increases, so that it becomes possible to prepare a semiconductor material having high conductivity.

In addition, since the second manner has been arranged in such that plural types of impurity raw materials are not supplied continuously, but supplied at close timings in a pulsed manner, it becomes possible to control each amount of impurity raw materials to be incorporated into atomic layers of crystals to be deposited on a substrate from the crystal raw materials, and thus, doping with impurities is made inside atomic layers at a suitable ratio, whereby a semiconductor material having an increased carrier concentration can be obtained.

Therefore, according to the second manner, such a theory that when two types of impurities are fed at a suitable ratio, its impurity level is changed to result in increase in activation rate can be realized.

Next, results of experiment for estimation by the present inventors will be described with respect to LEDs involving the p-type AlGaN layer 1010 doped with Mg which was pre-pared in accordance with the second manner in the above-described first and second manners. For LED 1000, three types of LEDs, i.e. LED type I, LED type II, and LED type III were prepared as described above.

Figure 17:
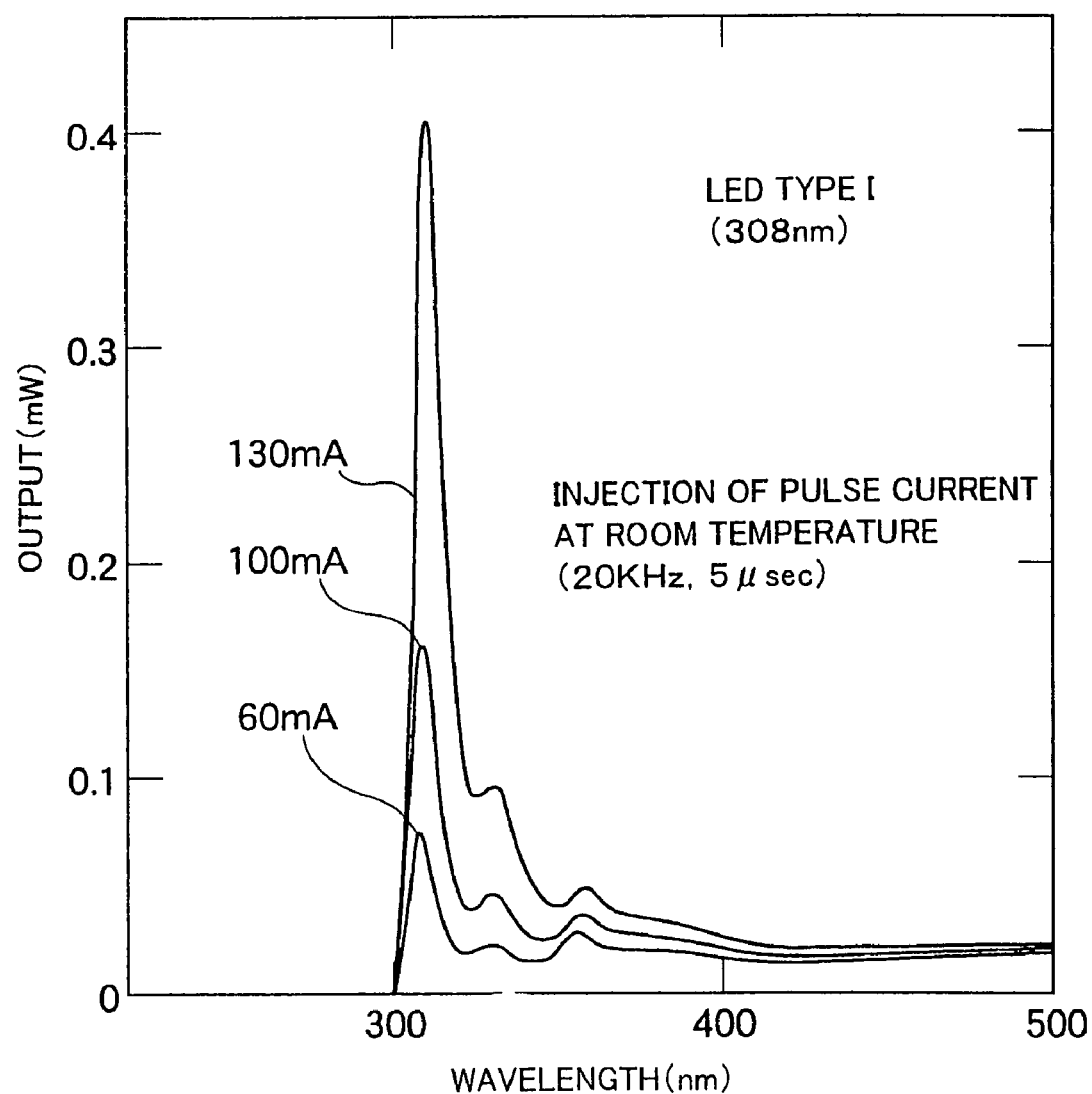
FIG. 17 is a graphical representation indicating ultraviolet output spectra of LED type I.
Figure 18:
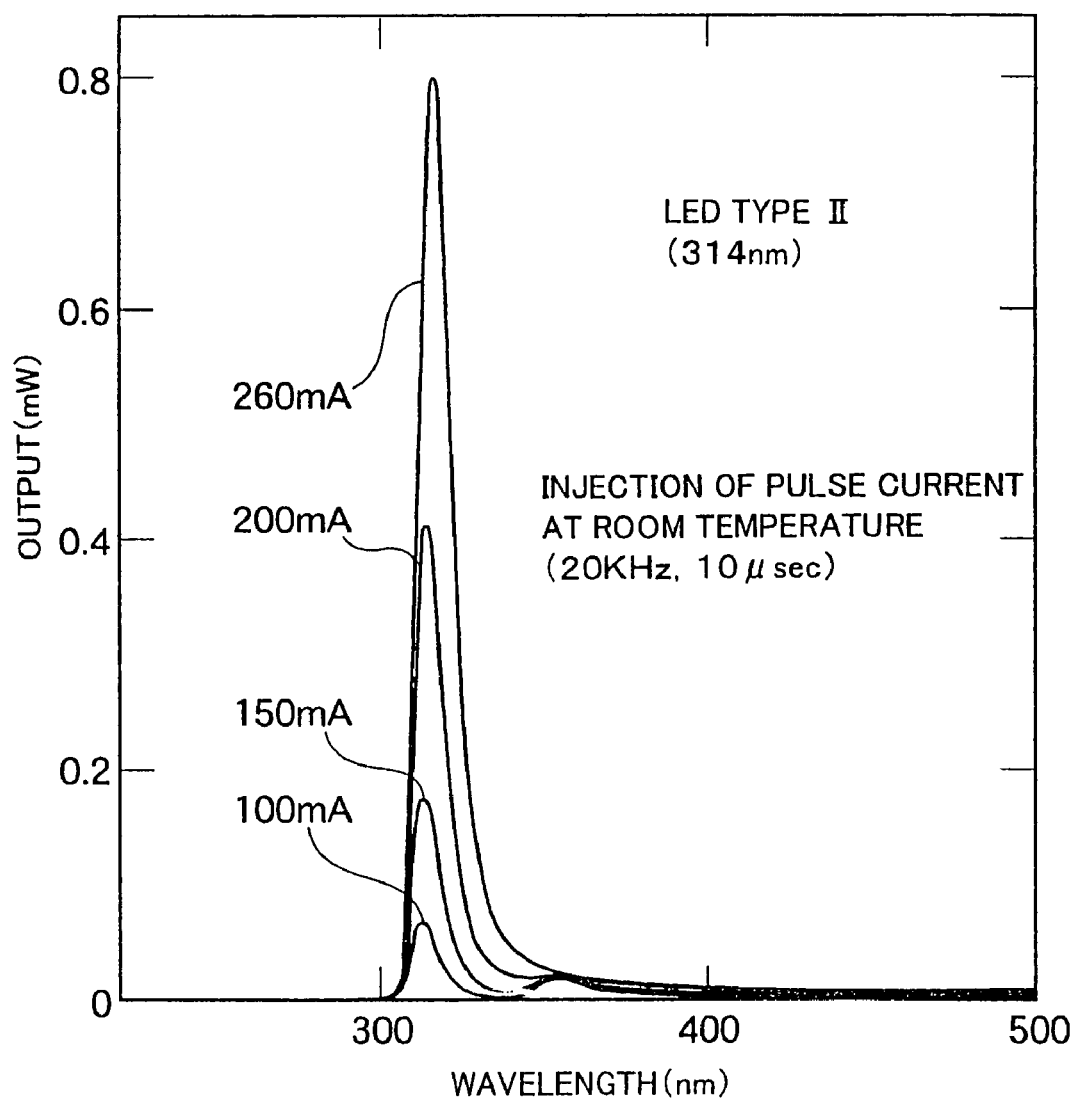
FIG. 18 is a graphical representation indicating ultraviolet output spectra of LED type II.
Figure 19:
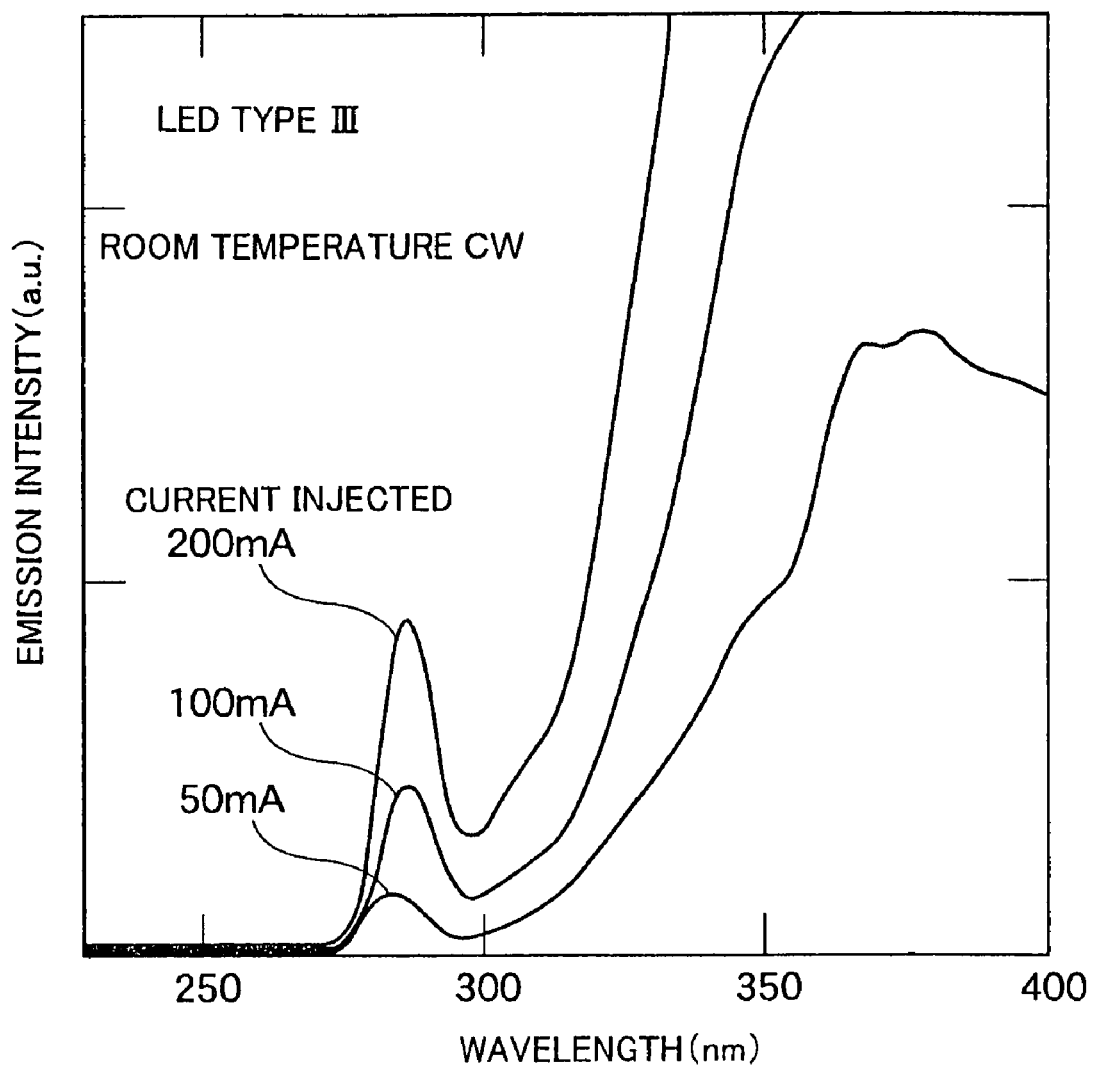
FIG. 19 is a graphical representation indicating ultraviolet output spectra of LED type III.

When pulsed current is injected upon LED 1000 of LEDs type I and type II at room temperature, the following results were obtained with single peak illumination. Namely, output of 0.4 mW was obtained by injecting current of 130 mA in the LED type I (wavelength 308 nm) (see FIG. 17), and output of 0.8 mW was obtained by injecting current of 260 mA in the LED type II (wavelength 314 nm).

On one hand, as a result of continuous current injection upon LED 1000 of LED type III at room temperature, an emission peak of wavelength 282 nm was observed.

Thus, according to the above-described alternate feeding method, it becomes possible to achieve a p-type crystal even in $Al_xGa_{1-x}N$ ($0.3 \leqq x \leqq 0.06$) corresponding to a region wherein a composition of Al is from 30 to 60%, so that an ultraviolet light-emitting device such as LED, and LD of wavelength 200 to 380 nm band, which could not have been realized heretofore, could be attained.

As a p-type semiconductor prepared in accordance with the alternate feeding method, the invention is not limited to only the above-described AlGaN, but AlN, GaN, InGaN, InAlGaN and the like may be prepared.

For instance, in case of p-type AlGaN, a range of Al composition extends from 0 to 100% (In this case, total of Al and Ga is 100%). In other words, all the compositions ranging from GaN to AlN are possible.

Furthermore, in case of p-type InAlGaN, such composition "In: 0 to 30%, Al: 0 to 100%, and total of In, Al, and Ga is 100%" can be achieved.

Moreover, when Mg is used as a p-type impurity relevant to p-type semiconductor, a range of Mg concentration in the p-type semiconductor is in, for example, $1 \times 10^{17}$ cm$^{-3}$ to $1 \times 10^{21}$ cm$^{-3}$.

Still further, although an InAlGaN ternary mixed crystal light-emitting layer ($In_xAl_yGa_{1-x-y}N$) 1008 has been used in the above-described LED 100 as a light-emitting layer, a composition of the light-emitting layer is not limited thereto, but it may be, for example, $Al_xGa_{1-x}N$ ($0 \leqq x \leqq 1$), $In_xGa_{1-x}N$ ($0 < x < 1$), $In_xAl_yGa_{1-x-y}N$ ($0 < x < 1$, $0 < y < 1$, $x+y=1$) or the like. In addition, bulk structure or quantum well structure may be properly used as its structure.

It is to be noted that the above-described preferred embodiments may be modified as described in the following paragraphs (1) through (4).

(1) In the above-described preferred embodiments, although the invention has been described with respect to the case of forming a p-type AlGaN crystal, the invention is not limited thereto as a matter of course, but a variety of crystals such as InGaN crystals, InAlGaN crystals, and GaN crystals are formed in accordance with the first or the second manner by the use of the above-described MOCVD apparatus 10 or the other apparatuses for crystal growth, whereby a semiconductor material may be prepared. When it is intended to form, for example, InGaN crystal in the above case, TMIn may be used in place of TMAl retained in the bubbler 15. In case of forming InAlGaN crystal, another bubbler being the same as the bubbler 15 and used for retaining TMIn may be arranged. Further, in case of forming GaN crystal, supply of Al may be stopped. Likewise, a variety of conditions may be modified.

(2) In the above-described preferred embodiments, although such a case wherein Ga is used for a crystal raw material A, Al is used for a crystal raw material B, N is used for a crystal raw material C, Mg is used for an impurity raw material D, and Si is used for an impurity raw material E has been described, the invention is not limited thereto as mentioned above.

For instance, the group III and II elements such as Al, In, B, Zn, and Cd other than Ga may be used for the crystal raw material A. The group III and II elements such as Ga, In, B, Zn, and Cd other than Al may be used for the crystal raw material B. The group V and VI elements such as As, P, S, Se, and Te other than N may be used for the crystal raw material C. Be may be used other than Mg for the impurity raw material D. For the impurity raw material E, O may be used other than Si.

Besides, the invention is not limited to use of one type each of materials with respect to the crystal raw materials A, B, and C, but two or more types of materials may be used. For instance, even when a mixed crystal consisting of crystal raw materials A and A', crystal raw materials B and B' as well as crystal raw materials C and C' is formed, a semiconductor crystal can be prepared by applying suitable modifications thereto in accordance with the present invention.

It is preferred that when an element of the group III is used for the crystal raw material A, an element of the group III is used for the crystal B together with an element of the group V is used for the crystal raw material C, while it is preferred that when an element of the group II is used for the crystal raw material A, an element of the group II is used for the crystal raw material B together with an element of the group VI is used for the crystal raw material C.

(3) In the above-described preferred embodiments, although it has been arranged in such that supply of the n-type impurity raw material E (TESi) is started immediately after the timing T1' at which supply of the p-type impurity raw material D (Cp$_2$Mg) was finished, the invention is not limited thereto, as a matter of course, but it may be arranged in such that supply of the n-type impurity raw material E (TESi) is started with a predetermined purging time after completing supply of the p-type impurity raw material D (Cp$_2$Mg).

On one hand, although it has been arranged in the above-described embodiments in such that supply of the crystal raw material C(NH$_3$) is commenced immediately after the timing T2 at which supply of the n-type impurity raw material E (TESi) was finished, the invention is not limited thereto, as a matter of course, but it may be arranged in such that supply of the crystal raw material C(NH$_3$) is commenced with a predetermined purging time after the timing T2 at which supply of the n-type impurity raw material E (TESi) was finished.

(4) The above-described preferred embodiments as well as modifications described in the above paragraphs (1), (2), and (3) may be properly combined with each other.

The present invention has been constituted as described above, so that the invention involves such excellent advantage that it becomes possible to provide an ultraviolet light-emitting device wherein a p-type semiconductor is used which has an emission peak in ultraviolet region and emits light efficiently due to the p-type semiconductor of high conductivity.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

The entire disclosure of Japanese Patent Application No. 2003-17397 filed on Jan. 27, 2003 including specification, claims, drawings and summary are incorporated herein by reference in its entirety.

What is claimed is:

1. A method for manufacturing an ultraviolet light-emitting device in which a p-type semiconductor is used,
wherein, in case of making crystal growth by supplying at least three types of crystal raw materials in a pulsed manner, said p-type semiconductor is prepared by supplying a p-type impurity raw material both at the same time when or after starting supply of at least two of at least three types of crystal raw materials, and before starting supply of the other type of crystal raw material than said at least two types of crystal raw materials in one cycle during which all the said at least three types of crystal raw materials are supplied once each, and
wherein the at least two of the at least three types of crystal raw materials are supplied simultaneously or at least in a partially time-overlapped manner.

2. The method for manufacturing an ultraviolet light-emitting device as claimed in claim 1, wherein said at least two types of crystal raw materials are the group III elements, and said other types of crystal raw materials are the group V elements.

3. A method for manufacturing an ultraviolet light-emitting device in which a p-type semiconductor is used,
wherein, in case of making crystal growth by supplying plural of types of crystal raw materials in a pulsed manner, said p-type semiconductor is prepared by supplying a p-type impurity raw material both at the same time when or after starting supply of predetermined types of crystal raw materials, and before starting supply of other types of crystal raw materials than said predetermined types of crystal raw materials in one cycle during which all the types of crystal raw materials of said plural types of crystal raw materials are supplied once each, with said predetermined types of crystal raw materials being the group III elements and said other types of crystal raw materials being the group V elements,
wherein said group III elements are Al and Ga, and said group V element is N, supply of Al and Ga and supply of N are carried out alternately in a pulsed manner, with Al and Ga being supplied simultaneously or at least in a partially time-overlapped manner, and said p-type impurity raw material is Mg and supplied only during the supply of Al and Ga or after starting of supply of Al and Ga and before starting of supply of N.

4. The method for manufacturing an ultraviolet light-emitting device as claimed in claim 3, wherein the ratio of Al to AlGaN is not less and 20%.

5. The method of manufacturing an ultraviolet light-emitting device as claimed in claim 3, wherein the ratio of Al is between 30% and 60%.

6. A method for manufacturing a p-type semiconductor used in an ultraviolet light-emitting device, wherein said p-type semiconductor is prepared by repeating:
a desired number of times for a cycle consisting of:
a first step wherein supply of TMGa, TMAl, and Cp$_2$Mg is commenced at a first timing, and supply of Cp$_2$Mg is finished at a second timing at which supply of Cp$_2$Mg which has been continued for a predetermined period of time was completed during the supply of TMGa and TMAl;
a second step wherein supply of TESi is commenced immediately after or after the second timing at which supply of Cp$_2$Mg is finished during the supply of TMGa and TMAl, and supply of TMGa, TMAl, and TESi is finished at a third timing at which supply of TESi which has been continued for a predetermined period of time is completed; and
a third step wherein supply of NH$_3$ is commenced immediately after or after the third timing at which supply of TMGa, TMAl, and TESi is completed, and supply of NH$_3$ is finished at a fourth timing at which supply of NH$_3$ which has been continued for a predetermined period of time is completed.

7. The method as claimed in claim 6, wherein a small amount of N is continuously supplied in case of preparing said p-type semiconductor.

8. A method for manufacturing an ultraviolet light-emitting device in which a p-type semiconductor is used, wherein, in case of making crystal growth by supplying plural types of crystal raw materials in a pulsed manner,
wherein said p-type semiconductor being composed of AlGaN prepared by laminating both a first crystal layer formed from Ga and Al which are supplied simultaneously or at least in a partially time-overlapped manner, and a second crystal layer formed from N, and wherein said first crystal layer formed from Ga and Al is doped with Mg and Si for their respective adjacent periods of time and Mg and Si is placed closely in said crystal layer formed from Ga and Al at a predetermined ratio.

9. The method for manufacturing an ultraviolet light-emitting device as claimed in claim 8, wherein said second crystal layer is not doped with impurities.

* * * * *